US007618680B2

(12) United States Patent
Gleason et al.

(10) Patent No.: US 7,618,680 B2
(45) Date of Patent: Nov. 17, 2009

(54) OXIDATIVE CHEMICAL VAPOR DEPOSITION OF ELECTRICALLY CONDUCTIVE AND ELECTROCHROMIC POLYMERS

(75) Inventors: Karen K. Gleason, Lexington, MA (US); John Lock, Somerville, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 657 days.

(21) Appl. No.: 11/141,353

(22) Filed: May 31, 2005

(65) Prior Publication Data

US 2006/0269664 A1 Nov. 30, 2006

(51) Int. Cl.
*C23C 16/00* (2006.01)
(52) U.S. Cl. ................ 427/248.1; 427/255.6
(58) Field of Classification Search ............... None
See application file for complete search history.

(56) References Cited

U.S. PATENT DOCUMENTS

| 4,652,396 | A | 3/1987 | Wagener | |
|---|---|---|---|---|
| 6,351,370 | B1* | 2/2002 | Konuma et al. | 361/523 |
| 2001/0005553 | A1* | 6/2001 | Witzman et al. | 428/402 |
| 2002/0034060 | A1* | 3/2002 | Konuma et al. | 361/326 |
| 2004/0102577 | A1* | 5/2004 | Hsu et al. | 525/182 |

OTHER PUBLICATIONS

B. Winther-Jensen, J. Chen, K. West, and G. Wallace, "Vapor phase polymerization of pyrrole and thiophene using iron(III) sulfonates as oxidizing agents," Macromolecules 37(16), 5930-5935.*

Jinyeol, K. et al., "The preparation and characteristics of conductive poly(3,4-ethylenedioxythiophene) thin film by vapor-phase polymerization", Database Compendex, Database No. E2003347697534, Engineering Information, Inc., NYC, NY and *Synthetic Metals*, 139(2):485-489 (Sep. 5, 2003).
International Search Report dated Nov. 15, 2006.
Mohammadi, A. et al., "Chemical Vapour Deposition (VD) of Conducting Polymers: Polypyrrole", *Synthetic Metals*, 14:189-197 (Elsevier Sequioa, The Netherlands)(1986).
Winther-Jensen, B., et al., "Vapor Phase Polymerization of Pyrrole and Thiophene Using Iron(III) Sulfonates as Oxidizing Agents," *Macromolecules* 2004, 37, 5930-5935.
Zuber, K.; et al.; "Improved PEDOT conductivity via suppression of crystalline formation of Fe(III) tosylate during vapor phase polymerization," *Macromolecular Rapid Communications* 2008, 29(18), 1503-1508.

* cited by examiner

*Primary Examiner*—Timothy H Meeks
*Assistant Examiner*—Joseph Miller, Jr.
(74) *Attorney, Agent, or Firm*—Foley Hoag LLP

(57) ABSTRACT

Remarkably, disclosed herein is a solvent-less chemical vapor deposition (CVD) method for the oxidative polymerization and deposition of thin films of electrically-conducting polymers. In a preferred embodiment, the method provides poly-3,4-ethylenedioxythiophene (PEDOT) thin films. In other embodiments, the method is applicable to polymerization to give other conducting polymers, such as polyanilines, polypyrroles, polythiophenes and their derivatives. The all-vapor technique uses a moderate substrate temperature, making it compatible with a range of materials, including as fabric and paper. In addition, this method allows for the coating of high surface-area substrates with fibrous, porous and/or particulate morphologies. The coated substrates may be used in organic semiconductor devices, including organic light-emitting diodes (OLEDs), photovoltaics, electrochromics, and supercapacitors.

31 Claims, 12 Drawing Sheets

[A]

[B]

[A]

[B]

[a]

[b]

OXIDATIVE CHEMICAL VAPOR DEPOSITION OF ELECTRICALLY CONDUCTIVE AND ELECTROCHROMIC POLYMERS

GOVERNMENT SUPPORT

This invention was made with support provided by the Army Research Office (Grant No. DAAD-19-02-D-0002); therefore, the government has certain rights in the invention.

BACKGROUND OF THE INVENTION

Conducting Polymers: Evolution and Applications. In 1977, the field of conducting polymeric materials, also known as synthetic metals, began with the discovery that polyacetylene conducts electricity. [H. Shirakawa, E. J. Louis, A. G. Macdiarmid, C. K. Chiang, and A. J. Heeger, "Synthesis of Electrically Conducting Organic Polymers—Halogen Derivatives of Polyacetylene, (Ch)X," Journal of the Chemical Society-Chemical Communications 16, 578-580 (1977).] Recent reviews examine efforts to incorporate conducting polymers into electronic devices, including light-emitting diodes (LEDs), electrochromic materials and structures, microelectronics, portable and large-area displays, and photovoltaics. [C. T. Chen, "Evolution of red organic light-emitting diodes: Materials and devices," Chemistry of Materials 16(23), 4389-4400 (2004); A. P. Kulkarni, C. J. Tonzola, A. Babel, and S. A. Jenekhe, "Electron transport materials for organic light-emitting diodes," Chemistry of Materials 16(23), 4556-4573 (2004); A. A. Argun, P. H. Aubert, B. C. Thompson, I. Schwendeman, C. L. Gaupp, J. Hwang, N. J. Pinto, D. B. Tanner, A. G. MacDiarmid, and J. R. Reynolds, "Multicolored electrochromism polymers: Structures and devices," Chemistry of Materials 16(23), 4401-4412 (2004); D. K. James and J. M. Tour, "Electrical measurements in molecular electronics," Chemistry of Materials 16(23), 4423-4435 (2004); C. R. Newman, C. D. Frisbie, D. A. da Silva, J. L. Bredas, P. C. Ewbank, and K. R. Mann, "Introduction to organic thin film transistors and design of n-channel organic semiconductors," Chemistry of Materials 16(23), 4436-4451 (2004); M. L. Chabinyc and A. Salleo, "Materials requirements and fabrication of active matrix arrays of organic thin-film transistors for displays," Chemistry of Materials 16(23), 4509-4521 (2004); and K. M. Coakley and M. D. McGehee, "Conjugated polymer photovoltaic cells," Chemistry of Materials 16(23), 4533-4542 (2004).]

A number of polymers, such as polyphenylene, polyaniline, polythiophene, polypyrrole, polycarbazole, and polysilane, have delocalized electrons along their backbones enabling charge conduction. The conductivity rises dramatically when anions present as dopants in the polymer matrix stabilize positive charges along the chain. Each of the conducting polymers can be substituted with a variety of functional groups to achieve different properties, so new derivatives continue to be synthesized. [J. L. Brédas and R. J. Silbey, Conjugated polymers: the novel science and technology of highly conducting and nonlinear optically active materials (Kluwer Academic Publishers, Dordrecht; Boston, 1991), pp. xviii, 624 p.; and T. A. Skotheim, R. L. Elsenbaumer, and J. R. Reynolds, Handbook of conducting polymers, 2nd ed. (M. Dekker, New York, 1998), pp. xiii, 1097 p.]

A promising conducting polymer is poly-3,4-ethylenedioxy-thiophene (PEDOT) developed by scientists at Bayer AG in Germany. [Bayer, Eur. Patent 339340 (1988); B. L. Groenendaal, F. Jonas, D. Freitag, H. Pielartzik, and J. R. Reynolds, "Poly(3,4-ethylenedioxythiophene) and its derivatives: Past, present, and future," Advanced Materials 12(7), 481-494 (2000); and F. Jonas and L. Schrader, "Conductive Modifications of Polymers with Polypyrroles and Polythiophenes," Synthetic Metals 41(3), 831-836 (1991).] It was initially designed to block the β-positions on the thiophene ring to prevent undesirable side reactions. The strategy worked and the ethylene bridge on the molecule also proved to be a good charge donor to the π-conjugated backbone, giving rise to an unusually high conductivity of 300 S/cm. [G. Heywang and F. Jonas, "Poly(Alkylenedioxythiophene)S—New, Very Stable Conducting Polymers," Advanced Materials 4(2), 116-118 (1992).] In addition, PEDOT films in their oxidized state were observed to be extremely stable for conducting polymers and nearly transparent. [M. Dietrich, J. Heinze, G. Heywang, and F. Jonas, "Electrochemical and Spectroscopic Characterization of Polyalkylenedioxythiophenes," Journal of Electroanalytical Chemistry 369(1-2), 87-92 (1994).] However, like other conjugated polymers that have a very rigid conformation in order to maintain electron orbital overlap along the backbone, PEDOT was found to be insoluble. Bayer addressed this problem by using a water soluble polyanion, polystyrene sulfonic acid (PSS), during polymerization as the charge-balancing dopant. The PEDOT:PSS system is marketed as BAYTRON P™ and it has good film forming capabilities, a conductivity of 10 S/cm, good transparency, and extremely good stability. In fact, the films can be heated in air over 100° C. for over 1000 hours with no major decline in conductivity. Studies demonstrate that Bayer's BAYTRON P materials (PEDOT stabilized with polystyrene sulfonate) can have increased conductivity up to 600 S/cm by adding N-methyl-pyrolidone (NMP) or other solvents that reduce screening effects of the polar solvent between the dopant and the polymer main chain. [F. Louwet, L. Groenendaal, J. Dhaen, J. Manca, J. Van Luppen, E. Verdonck, and L. Leenders, "PEDOT/PSS: synthesis, characterization, properties and applications," Synthetic Metals 135(1-3), 115-117 (2003); and J. Y. Kim, J. H. Jung, D. E. Lee, and J. Joo, "Enhancement of electrical conductivity of poly(3,4-ethylenedioxythiophene)/poly(4-styrenesulfonate) by a change of solvents," Synthetic Metals 126(2-3), 311-316 (2002).] Bayer's first major customer for BATRON P was Agfa who used the material as an anti-static coating on photographic film. [F. Jonas, W. Kraffi, and B. Muys, "Poly(3,4-Ethylenedioxythiophene)—Conductive Coatings, Technical Applications and Properties," Macromolecular Symposia 100, 169-173 (1995); Bayer, European Pat 440957 (1991); and Agfa, European Patent 564911 (1993).] Any spark generated by static electricity can expose film showing up as a bright spot on developed photos. Bayer has since enjoyed wide utilization of BAYTRON P as an electrode material in capacitors and a material for through-hole plating of printed circuit boards. [F. Jonas and J. T. Morrison, "3,4-polyethylenedioxythiophene (PEDT): Conductive coatings technical applications and properties," Synthetic Metals 85(1-3), 1397-1398 (1997); Bayer, European Patent 533671 (1993); Bayer, European Patent 686662 (1995); Bayer, U.S. Pat. No. 5,792, 558 (1996); and F. Jonas and G. Heywang, "Technical Applications for Conductive Polymers," Electrochimica Acta 39(8-9), 1345-1347 (1994).] BAYTRON P has also been found to be suitable as a hole-injecting layer in LEDs and photovoltaics, increasing device efficiency by up to 50%. [T. M. Brown, J. S. Kim, R. H. Friend, F. Cacialli, R. Daik, and W. J. Feast, "Built-in field electroabsorption spectroscopy of polymer light-emitting diodes incorporating a doped poly(3,4-ethylene dioxythiophene) hole injection layer," Applied Physics Letters 75(12), 1679-1681 (1999); and G. Greczynski, T. Kugler, M. Keil, W. Osikowicz, M. Fahlman, and W. R.

Salaneck, "Photoelectron spectroscopy of thin films of PEDOT-PSS conjugated polymer blend: a mini-review and some new results," Journal of Electron Spectroscopy and Related Phenomena 121(1-3), 1-17 (2001).]

Most conducting polymer materials are formed via oxidative polymerization of aniline, pyrrole, thiophene, and their derivatives. [A. Malinauskas, "Chemical deposition of conducting polymers," Polymer 42(9), 3957-3972 (2001).] It has not been feasible to process bulk material of these polymers into thin films since they are insoluble and non-melting, but coating techniques have been developed on substrates including plastic, glass, metal, fabric and micro- and nano-particles. There are four main approaches to form coatings of anilines, pyrroles, and thiophenes via oxidative polymerization on various materials: electropolymerization of monomers at electrodes, casting a solution of monomer and oxidant on a surface and allowing the solvent to evaporate, immersing a substrate in a solution of monomer and oxidant during polymerization, and chemical oxidation of a monomer directly on a substrate surface that has been enriched with an oxidant.

Electrochemical Oxidative Polymerization. Historically, electrochemical oxidation on different electrode materials has been the primary route to conducting polyaniline, polypyrrole films, polythiophene, and their derivatives. [E. M. Genies, A. Boyle, M. Lapkowski, and C. Tsintavis, "Polyaniline—a Historical Survey," Synthetic Metals 36(2), 139-182 (1990); L. X. Wang, X. G. Li, and Y. L. Yang, "Preparation, properties and applications of polypyrroles," Reactive & Functional Polymers 47(2), 125-139 (2001); E. Smela, "Microfabrication of PPy microactuators and other conjugated polymer devices," Journal of Micromechanics and Microengineering 9(1), 1-18 (1999); Q. B. Pei, G. Zuccarello, M. Ahlskog, and O. Inganas, "Electrochromic and Highly Stable Poly(3,4-Ethylenedioxythiophene) Switches between Opaque Blue-Black and Transparent Sky Blue," Polymer 35(7), 1347-1351 (1994); R. Kiebooms, A. Aleshin, K. Hutchison, and F. Wudl, "Thermal and electromagnetic behavior of doped poly(3,4-ethylenedioxythiophene) films," Journal of Physical Chemistry B 101(51), 11037-11039 (1997); A. M. White and R. C. T. Slade, "Electrochemically and vapour grown electrode coatings of poly(3,4-ethylenedioxythiophene) doped with heteropolyacids," Electrochimica Acta 49(6), 861-865 (2004); and A. Aleshin, R. Kiebooms, R. Menon, F. Wudl, and A. J. Heeger, "Metallic conductivity at low temperatures in poly(3,4-ethylenedioxythiophene) doped with PF6," Physical Review B 56(7), 3659-3663 (1997).] Deposition takes place on an inert electrode material, which is usually platinum, but can also be iron, copper, zinc, chrome-gold, lead, palladium, different types of carbon, semiconductors, or on transparent electrodes like indium tin oxide. [D. W. Deberry, "Modification of the Electrochemical and Corrosion Behavior of Stainless-Steels with an Electroactive Coating," Journal of the Electrochemical Society 132(5), 1022-1026 (1985); G. Mengoli, M. M. Musiani, B. Pelli, and E. Vecchi, "Anodic Synthesis of Sulfur-Bridged Polyaniline Coatings onto Fe Sheets," Journal of Applied Polymer Science 28(3), 1125-1136 (1983); and G. Mengoli, M. T. Munari, and C. Folonari, "Anodic Formation of Polynitroanilide Films onto Copper," Journal of Electroanalytical Chemistry 124(1-2), 237-246 (1981).] Electrochemical oxidation takes place in an acidic electrolytic solution having anions like chloride, sulfate, fluorosulfonates, and hexafluorophosphate. Deposition occurs as the potential of the electrode is cycled in a range of around −0.6 V to 1 V. Aniline and pyrrole polymerized electrochemically have conductivities ranging as high as 10 S/cm. Electrochemically deposited polythiophenes, especially the poly-3,4-ethylenedioxythiophene (PEDOT) derivative, have reached conductivities that are an order of magnitude higher, around 200 to 300 S/cm. [H. Yamato, K. Kai, M. Ohwa, T. Asakura, T. Koshiba, and W. Wernet, "Synthesis of free-standing poly(3, 4-ethylenedioxythiophene) conducting polymer films on a pilot scale," Synthetic Metals 83(2), 125-130 (1996).] Using a variety of heteropolyacids as dopants in the electrolyte solution has enabled the formation of free-standing films as opposed to coatings on electrodes. Although electrochemical polymerization produces films that are not processible, it has the advantage of making a clean product that does not need to be extracted from a solution. The experimental setup can also be coupled to physical spectroscopic techniques like visible, IR, Raman, and ellipsometry for in-situ characterization.

Solution-Based Oxidative Polymerization. Chemical oxidation of pure and substituted aniline, pyrrole, and thiophene can also take place in solution in the presence of an oxidant, for example iron(III) chloride, iron(III) toslyate, hydrogen peroxide, potassium iodate, potassium chromate, ammonium sulfate, and tetrabutylammonium persulfate (TBAP). [A. Yasuda and T. Shimidzu, "Chemical Oxidative Polymerization of Aniline with Ferric-Chloride," Polymer Journal 25(4), 329-338 (1993); R. Corradi and S. P. Armes, "Chemical synthesis of poly(3,4-ethylenedioxythiophene)," Synthetic Metals 84(1-3), 453-454 (1997); T. Yamamoto and M. Abla, "Synthesis of non-doped poly(3,4-ethylenedioxythiophene) and its spectroscopic data," Synthetic Metals 100(2), 237-239 (1999); F. Tran-Van, S. Garreau, G. Louarn, G. Froyer, and C. Chevrot, "Fully undoped and soluble oligo(3,4-ethylenedioxythiophene)s: spectroscopic study and electrochemical characterization," Journal of Materials Chemistry 11(5), 1378-1382 (2001); D. Hohnholz, A. G. MacDiarmid, D. M. Sarno, and W. E. Jones, "Uniform thin films of poly-3,4-ethylenedioxythiophene (PEDOT) prepared by in-situ deposition," Chemical Communications (23), 2444-2445 (2001); A. Pron, F. Genoud, C. Menardo, and M. Nechtschein, "The Effect of the Oxidation Conditions on the Chemical Polymerization of Polyaniline," Synthetic Metals 24(3), 193-201 (1988); M. Angelopoulos, G. E. Asturias, S. P. Ermer, A. Ray, E. M. Scherr, A. G. Macdiarmid, M. Akhtar, Z. Kiss, and A. J. Epstein, "Polyaniline—Solutions, Films and Oxidation-State," Molecular Crystals and Liquid Crystals 160, 151-163 (1988); Y. Cao, A. Andreatta, A. J. Heeger, and P. Smith, "Influence of Chemical Polymerization Conditions on the Properties of Polyaniline," Polymer 30(12), 2305-2311 (1989); J. C. Chiang and A. G. Macdiarmid, "Polyaniline—Protonic Acid Doping of the Emeraldine Form to the Metallic Regime," Synthetic Metals 13(1-3), 193-205 (1986); and I. Kogan, L. Fokeeva, I. Shunina, Y. Estrin, L. Kasumova, M. Kaplunov, G. Davidova, and E. Knerelman, "An oxidizing agent for aniline polymerization," Synthetic Metals 100(3), 303-303 (1999).]

The strongest of the acid anions (e.g., chloride) often result in the highest conductivities. Chemical oxidation has been shown to produce polymers with comparable conductivities to electrochemically deposited films using the same oxidant. [J. A. Walker, L. F. Warren, and E. F. Witucki, "New Chemically Prepared Conducting Pyrrole Blacks," Journal of Polymer Science Part a-Polymer Chemistry 26(5), 1285-1294 (1988).] Generally, polar solvents like alcohols and acetonitrile are used and reactions take place over a range of oxidant concentrations and temperatures including 0 to 80° C., under acidic or basic conditions. [L. Yu, M. Borredon, M. Jozefowicz, G. Belorgey, and R. Buvet, Journal of Polymer Science Part A-Polymer Chemistry 10, 2931 (1987).] However, these parameters can influence the yield of polymerization and the conductivity of the final product. Solution-based chemical oxidation produces powder precipitates that are packed into the form of a tablet and then characterized since they are generally insoluble and do not melt. The polymerized material is usually rinsed in water, methanol, or acetonitrile to remove unreacted oxidant. Improved conductivities can be obtained after rinsing the material in a solution containing anionic dopants like hydrochloric acid (HCl) or dissolved nitrosonium hexafluorophosphate ($NOPF_6$). Chemical polymerization of aniline and pyrrole results in conductivities as high as 10 or 50 S/cm, although using TBAP was reported to give polyaniline with a conductivity of 400 S/cm. PEDOT can often have a conductivity of up to 200 or 300 S/cm. Forming a film with these materials has been demonstrated by immersing a substrate in the reaction solution during polymerization.

Polyaniline was also synthesized via the Ullmann reaction using p-bromoaniline as a precursor, but a low conductivity of only $10^{-6}$ S/cm was measured. [F. Ullmann, Ber Dtsch Chem Ges 36, 2382-2384 (1903).] Interfacial polymerization of pyrrole using an aqueous oxidant solution and an organic phase with dissolved monomer achieved free-standing thin films with conductivities of as high as 50 S/cm. [M. Nakata, M. Taga, and H. Kise, "Synthesis of Electrical Conductive Polypyrrole Films by Interphase Oxidative Polymerization—Effects of Polymerization Temperature and Oxidizing-Agents," Polymer Journal 24(5), 437-441 (1992).]

Oxidative Polymerization of Vapor-Phase Monomers. Dipping a substrate material into a solution containing oxidants like $FeCl_3$ and $Fe(OTs)_3$ and allowing it to dry yields an oxidant-enriched substrate that can provide a reactive surface that polymerizes volatile monomers including aniline, pyrrole, thiophene, and their derivatives. [B. Winther-Jensen, J. Chen, K. West, and G. Wallace, "Vapor phase polymerization of pyrrole and thiophene using iron(III) sulfonates as oxidizing agents," Macromolecules 37(16), 5930-5935 (2004); J. Kim, E. Kim, Y. Won, H. Lee, and K. Suh, "The preparation and characteristics of conductive poly(3,4-ethylenedioxythiophene) thin film by vapor-phase polymerization," Synthetic Metals 139(2), 485-489 (2003); and B. Winther-Jensen and K. West, "Vapor-phase polymerization of 3,4-ethylenedioxythiophene: A route to highly conducting polymer surface layers," Macromolecules 37(12), 4538-4543 (2004).] A conductivity of 50 S/cm has been achieved using this method for polypyrrole and 500 to 1000 S/cm has been reported for PEDOT. Oxidant pretreatment has been extended to glass substrates, polymers, fabrics, and-even individual fibers. [S. N. Tan and H. L. Ge, "Investigation into vapour-phase formation of polypyrrole," Polymer 37(6), 965-968 (1996); A. Mohammadi, I. Lundstrom, and O. Inganas, "Synthesis of Conducting Polypyrrole on a Polymeric Template," Synthetic Metals 41(1-2), 381-384 (1991); and C. C. Xu, P. Wang, and X. T. Bi, "Continuous Vapor-Phase Polymerization of Pyrrole .1. Electrically Conductive Composite Fiber of Polypyrrole with Poly(P-Phenylene Terephthalamide)," Journal of Applied Polymer Science 58(12), 2155-2159 (1995).] Pretreating a surface with iodine vapors present a solvent-less polymerization process for polypyrrole, but only low conductivities ranging from $10^{-7}$ to $10^{-1}$ S/cm result. [S. L. Shenoy, D. Cohen, C. Erkey, and R. A. Weiss, "A solvent-free process for preparing conductive elastomers by an in situ polymerization of pyrrole," Industrial & Engineering Chemistry Research 41(6), 1484-1488 (2002).]

Another solvent-less deposition process has been demonstrated for polypyrrole that eliminates the step of dip-coating a substrate in an oxidant solution, although it is restricted to metallic substrates. The surface of metals including copper, iron, gold, and palladium can be converted into salts by exposing them to vapors of chlorine, iodine, bromine and acids with $F^-$, $NO_3^-$, $SO_4^{2-}$, and $ClO_4^-$ anions. Subsequent introduction of monomer vapor results in polymer films with conductivities of around 1 to 10 S/cm. [G. Serra, R. Stella, and D. De Rossi, "Study of the influence of oxidising salt on conducting polymer sensor properties," Materials Science & Engineering C-Biomimetic Materials Sensors and Systems 5(3-4), 259-263 (1998); A. Nannini and G. Serra, "Growth of Polypyrrole in a Pattern—a Technological Approach to Conducting Polymers," Journal of Molecular Electronics 6(2), 81-88 (1990); F. Cacialli and P. Bruschi, "Site-selective chemical-vapor-deposition of submicron-wide conducting polypyrrole films: Morphological investigations with the scanning electron and the atomic force microscope," Journal of Applied Physics 80(1), 70-75 (1996); and P. Bruschi, F. Cacialli, A. Nannini, and B. Neri, "Low-Frequency Resistance Fluctuation Measurements on Conducting Polymer Thin-Film Resistors," Journal of Applied Physics 76(6), 3640-3644 (1994).]

Non-Oxidative Polymerization of Vapor-Phase Monomers. Vacuum deposition of polyaniline films using evaporation has been demonstrated yielding conductivities of about $10^{-4}$ S/cm. [T. L. Porter, K. Caple, and G. Caple, "Structure of Chemically Prepared Freestanding and Vacuum-Evaporated Polyaniline Thin-Films," Journal of Vacuum Science & Technology a-Vacuum Surfaces and Films 12(4), 2441-2445 (1994); and T. R. Dillingham, D. M. Cornelison, and E. Bullock, "Investigation of Vapor-Deposited Polyaniline Thin-Films," Journal of Vacuum Science & Technology a-Vacuum Surfaces and Films 12(4), 2436-2440 (1994).] Solid polyaniline can be sublimed at temperatures of about 400° C. and pressures of $10^{-5}$ or $10^{-6}$ Torr. Compositional analysis using XPS showed a carbon-to-nitrogen ratio of about 6:1 for the source material. A slightly higher C/N ratio in the deposited film indicates that short oligomers preferentially sublime.

Plasma-enhanced chemical vapor deposition (PECVD) has been investigated as a method of depositing aniline, thiophene and parylene-substituted precursors yielding low conductivities of only $10^{-4}$ S/cm due to ring breakage and other imperfections caused by the high energies inherent with plasma. [C. J. Mathai, S. Saravanan, M. R. Anantharaman, S. Venkitachalam, and S. Jayalekshmi, "Characterization of low dielectric constant polyaniline thin film synthesized by ac plasma polymerization technique," Journal of Physics D-Applied Physics 35(3), 240-245 (2002); K. Tanaka, K. Yoshizawa, T. Takeuchi, T. Yamabe, and J. Yamauchi, "Plasma Polymerization of Thiophene and 3-Methylthiophene," Synthetic Metals 38(1), 107-116 (1990).; L. M. H. Groenewoud, G. H. M. Engbers, R. White, and J. Feijen, "On the iodine doping process of plasma polymerised thiophene layers," Synthetic Metals 125(3), 429-440 (2001); and L. M. H. Groenewoud, A. E. Weinbeck, G. H. M. Engbers, and J. Feijen, "Effect of dopants on the transparency and stability of the conductivity of plasma polymerised thiophene layers," Synthetic Metals 126(2-3), 143-149 (2002).] Another conjugated monomer, 3,4,9,10-perylenetetracarboxylic dianhydride (PTCDA), fared much better using PECVD with reported conductivities as high as 50 S/cm. [M. Murashima, K. Tanaka, and T. Yamabe, "Electrical-Conductivity of Plasma-Polymerized Organic Thin-Films—Influence of Plasma Polymerization Conditions and Surface-Composition," Synthetic Metals 33(3), 373-380 (1989).]

Thermally activated hot-wire CVD has been used to polymerize aniline and vinyl-containing monomers including phenylenevinylene and vinylcarbazole, but no conductivities of these materials have been reported. [G. A. Zaharias, H. H. Shi, and S. F. Bent, "Hot Wire Chemical Vapor Deposition as a Novel Synthetic Method for Electroactive Organic Thin Films," Mat. Res. Soc. Symp. Proc. 814, I12.19.11-I12.19.16 (2004); K. M. Vaeth and K. F. Jensen, "Chemical vapor deposition of thin polymer films used is polymer-based light emitting diodes," Advanced Materials 9(6), 490-& (1997); K. M. Vaeth and K. F. Jensen, "Transition metals for selective chemical vapor deposition of parylene-based polymers," Chemistry of Materials 12(5), 1305-1313 (2000); and M. Tamada, H. Omichi, and N. Okui, "Preparation of polyvinylcarbazole thin film with vapor deposition polymerization," Thin Solid Films 268(1-2), 18-21 (1995).] Photo-induced CVD was used to couple thiophene monomers that were halogenated with bromine and chlorine at the 2- and 5-positions. [T. Sorita, H. Fujioka, M. Inoue, and H. Nakajima, "Formation of Polymerized Thiophene Films by Photochemical Vapor-Deposition," Thin Solid Films 177, 295-303 (1989).] Although the monomers only coupled at the halogenated positions, only relatively low conductivities of $10^{-13}$ S/cm were achieved. However, dibrominated PEDOT polymerizes upon heating and makes films with a conductivity of 20 S/cm. [H. Meng, D. F. Perepichka, M. Bendikov, F. Wudl, G. Z. Pan, W. J. Yu, W. J. Dong, and S. Brown, "Solid-state synthesis of a conducting polythiophene via an unprecedented heterocyclic coupling reaction," Journal of the American Chemical Society 125(49), 15151-15162 (2003).]

Norborene and a ruthenium(IV)-based catalyst volatilized in a chamber under low pressure resulted in a film of polynorborene on a silicon substrate. [H. W. Gu, D. Fu, L. T. Weng, J. Xie, and B. Xu, "Solvent-less polymerization to grow thin films on solid substrates," Advanced Functional Materials 14(5), 492-500 (2004).] The monomer undergoes a ring-opening metathesis polymerization mechanism when contacted by the catalyst. [T. M. Trnka and R. H. Grubbs, "The development of L2X2Ru=CHR olefin metathesis catalysts: An organometallic success story," Accounts of Chemical Research 34(1), 18-29 (2001).] The technique was repeated based on the same polymerization mechanism using 1,3,5,7-cyclooctatetetraene to form polyacetylene. [H. W. Gu, R. K. Zheng, X. X. Zhang, and B. Xu, "Using soft lithography to pattern highly oriented polyacetylene (HOPA) films via solvent-less polymerization," Advanced Materials 16(15), 1356 (2004).] The deposition is slow and an electrical conductivity was not reported.

As described above, existing synthesis techniques for conducting polymers preclude their deposition on some substrates like paper or on top of other materials that are incompatible with solutions-based processing. This fact generally limits their application in electronic devices to use as a bottom-electrode layer or as a coating on a bottom electrode to facilitate better hole injection. The development of a robust vapor-deposition technique for conducting polymers that preserves their high conductivity and is compatible with moisture-sensitive, temperature-sensitive, and mechanically fragile surfaces is needed to broaden their utilization, enabling both improved efficiencies in existing devices and development of new devices on unconventional substrates. Such a robust vapor-deposition technique is described herein.

SUMMARY OF THE INVENTION

Remarkably, disclosed herein is a solvent-less chemical vapor deposition (CVD) method for the oxidative polymerization and deposition of thin films of electrically-conducting polymers. In a preferred embodiment, the method provides poly-3,4-ethylenedioxythiophene (PEDOT) thin films. In other embodiments, the method is applicable to polymerization to give other conducting polymers, such as polyanilines, polypyrroles, polythiophenes and their derivatives. The all-vapor technique uses a moderate substrate temperature, making it compatible with a range of materials, including as fabric and paper. In addition, this method allows for the coating of high surface-area substrates with fibrous, porous and/or particulate morphologies. The coated substrates may be used in organic semiconductor devices, including organic light-emitting diodes (OLEDs), photovoltaics, electrochromics, and supercapacitors.

DETAILED DESCRIPTION OF THE INVENTION

Figure 1:
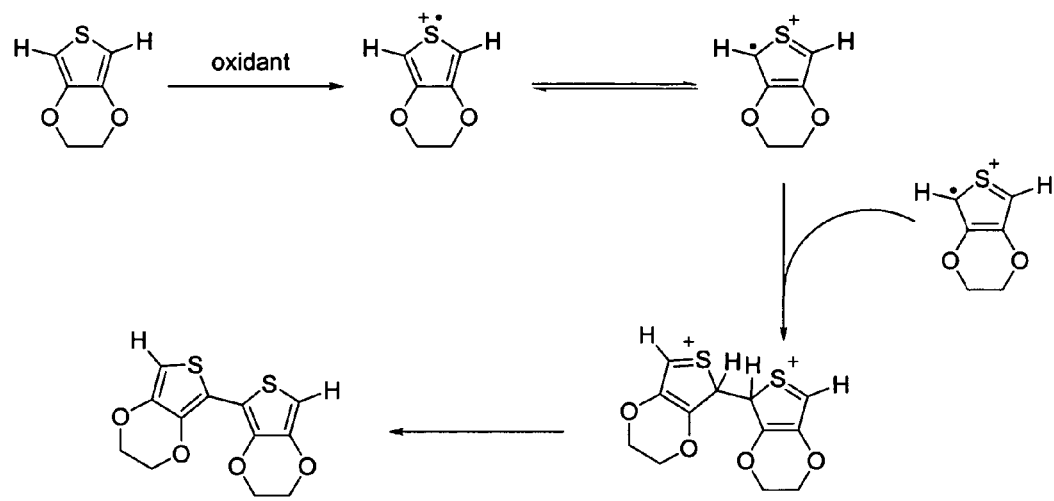
FIG. 1(A) depicts the Diaz mechanism for oxidative polymerization; and (B) depicts the oxidation of neutral poly-3,4-ethylenedioxythiophene (PEDOT) to form a conducting polycation that is charged balanced with dopant anions ($A^-$). In certain embodiments these dopant anions are covalently linked to form a polyanion.
Figure 1:
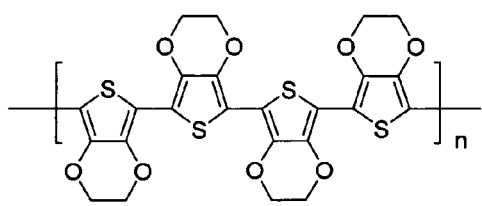
Figure 1:

Overview. Electropolymerization of EDOT has been the most commonly used deposition technique for PEDOT and other conducting polymers. Electrode coatings and free-standing PEDOT films with conductivities around 300 S/cm are possible, which is an order of magnitude higher than the conductivity of polypyrrole films deposited using the same method. Chemical oxidative polymerization of EDOT in a solution containing oxidants like $FeCl_3$ or $Fe(OTs)_3$ yields PEDOT material with similar conductivities. The reaction mixture can be cast on a surface leaving a polymerized film as the solvent evaporates and films may also be deposited on substrates that are immersed in the polymerizing reaction mixture. However, like other conjugated polymers that adopt a very rigid conformation in order to maintain electron orbital overlap along the backbone, PEDOT is insoluble and does not melt, precluding subsequent processing. Bayer circumvented this problem by using a water soluble polyanion, polystyrene sulfonic acid (PSS), during polymerization as the charge-balancing dopant. The aqueous PEDOT: PSS system, now marketed as BAYTRON P™, has a good shelf life and film forming capabilities while maintaining its transparency, stability, and a conductivity of 10 S/cm. However, the PSS dopant incorporates a non-conducting matrix material and makes the coating solution acidic. This fact leads to different film forming characteristics depending on the ability of the solution to wet different materials like glass, plastic, or other active layers in a device. In addition, some devices simply are not compatible with wet processing techniques.

Therefore, the development of a robust vapor-deposition technique for PEDOT films would simplify the coating process on a variety of organic and inorganic materials since it would not depend on evenly wetting the substrate surface. Vapor-phase deposition would also provide uniform coatings on substrates with high surface areas due to roughness or fibrous and porous morphologies. Increasing the effective surface area of devices will improve operating efficiencies and coating unconventional surfaces like paper, fabric, and small particles can lead to the innovation of new devices. Recent experiments have advanced the development of vapor-phase techniques using oxidant-enriched substrates which have been coated with solutions of Fe(III) tosylate and allowed to dry. Exposing the treated surface to EDOT vapors results in the polymerization of films with conductivities reported to be as high as 1000 S/cm. [J. Kim, E. Kim, Y. Won, H. Lee, K. Suh, Synthetic Metals 139, 485 (2003); and B. Winther-Jensen, K. West, Macromolecules 37, 4538 (2004).] However, no one has yet achieved a truly all-dry process for the deposition of PEDOT thin films.

Disclosed herein is a chemical vapor deposition (CVD) process that forms thin films of electrically active polymers. In one embodiment, the technique has been demonstrated to make PEDOT that has a conductivity over 4 S/cm and is spectroscopically comparable to commercial product deposited from the solution phase. This technique is applicable to other oxidatively polymerized conducting materials like polypyrrole, polyaniline, polythiophene, and their substituted derivatives. Side reactions stemming from acid generation during oxidative polymerization can lead to bond breakage in the monomer and the formation of unconjugated oligomers that result in films with low conductivities. These unwanted reactions have been minimized in the instant invention via three different methods: introducing pyridine as a base, heating the substrate (e.g., the surface to be coated), and applying a bias to the sample stage.

CVD offers an all-dry process for depositing thin films of conducting polymers, which are currently available on the market only as solution-based materials. Commercial PEDOT films deposited onto anodes from solution facilitate hole injection and have already resulted in significant efficiency gains on the order of 50% for organic LED and photovoltaic devices. Using CVD to provide uniform coatings on rough electrode surfaces will lead to further improvements in efficiency by increasing the effective surface area while avoiding sharp electrode features from protruding through the film and shorting the device. The absence of the acidity associated with solution-based films will also reduce corrosion of neighboring layers that can cause early device failure. Moderate stage temperatures and vapor phase coating make CVD capable of depositing conducting films on a wide range of unconventional organic and inorganic high surface-area materials, including paper, fabric, and small particles. CVD will be a significant tool for organic semiconductor manufacturers seeking capabilities to incorporate conducting polymers in all-dry fabrication processes.

Definitions. For convenience, certain terms employed in the specification, examples, and appended claims are collected here.

"PEDOT" as used herein is an abbreviation for poly-3,4-ethylenedioxythiophene. "EDOT" as used herein is an abbreviation for the monomer 3,4-ethylenedioxythiophene. "CVD" as used here is an abbreviation for chemical vapor deposition.

The term "surface" or "surfaces" can mean any surface of any material, including glass, plastics, metals, polymers, paper, fabric and the like. It can include surfaces constructed out of more than one material, including coated surfaces. Non-limiting examples of surfaces include paper, ceramics, carbon, fabric, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-tex®, Marlex®, expanded polytetrafluoroethylene (e-PTFE), low density polyethylene (LDPE), high density polyethylene (HDPE), polypropylene (PP), and poly(ethylene terephthalate) (PET).

A "dopant anion" as used herein provides stability enhancement for electroactive polymers. The dopant may be any compound as long as it has a doping ability (i.e. stabilizing ability). For example, an organic sulfonic acid, an inorganic sulfonic acid, an organic carboxylic acid or salts thereof such as a metal salt or an ammonium salt may be used. The method for adding the dopant is not limited and the compound may be added to the oxidizing agent and/or the monomer, may be allowed to be present together at the time of polymerization or may be added by other methods. In certain embodiments the dopant molecule comprises aqueous solutions of the acids selected from the group consisting of phosphoric acid, triflic acid, hydrochloric acid, methanesulfonic acid, oxalic acid, pyruvic acid, and acrylic acid, or a poly anion incorporating one or more of the aforementioned types of acids.

The term "heteroatom" is art-recognized and refers to an atom of any element other than carbon or hydrogen. Illustrative heteroatoms include boron, nitrogen, oxygen, phosphorus, sulfur and selenium.

The term "alkyl" is art-recognized, and includes saturated aliphatic groups, including straight-chain alkyl groups, branched-chain alkyl groups, cycloalkyl (alicyclic) groups, alkyl substituted cycloalkyl groups, and cycloalkyl substituted alkyl groups. In certain embodiments, a straight chain or branched chain alkyl has about 30 or fewer carbon atoms in its backbone (e.g., $C_1$-$C_{30}$ for straight chain, $C_3$-$C_{30}$ for branched chain), and alternatively, about 20 or fewer. Likewise, cycloalkyls have from about 3 to about 10 carbon atoms in their ring structure, and alternatively about 5, 6 or 7 carbons in the ring structure.

Unless the number of carbons is otherwise specified, "lower alkyl" refers to an alkyl group, as defined above, but having from one to about ten carbons, alternatively from one to about six carbon atoms in its backbone structure. Likewise, "lower alkenyl" and "lower alkynyl" have similar chain lengths.

The term "aralkyl" is art-recognized and refers to an alkyl group substituted with an aryl group (e.g., an aromatic or heteroaromatic group).

The terms "alkenyl" and "alkynyl" are art-recognized and refer to unsaturated aliphatic groups analogous in length and possible substitution to the alkyls described above, but that contain at least one double or triple bond respectively.

The term "aryl" is art-recognized and refers to 5-, 6- and 7-membered single-ring aromatic groups that may include from zero to four heteroatoms, for example, benzene, naphthalene, anthracene, pyrene, pyrrole, furan, thiophene, imidazole, oxazole, thiazole, triazole, pyrazole, pyridine, pyrazine, pyridazine and pyrimidine, and the like. Those aryl groups having heteroatoms in the ring structure may also be referred to as "aryl heterocycles" or "heteroaromatics." The aromatic ring may be substituted at one or more ring positions with such substituents as described above, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —$CF_3$, —CN, or the like. The term "aryl" also includes polycyclic ring systems having two or more cyclic rings in which two or more carbons are common to two adjoining rings (the rings are "fused rings") wherein at least one of the rings is aromatic, e.g., the other cyclic rings may be cycloalkyls, cycloalkenyls, cycloalkynyls, aryls and/or heterocyclyls.

The terms ortho, meta and para are art-recognized and refer to 1,2-, 1,3- and 1,4-disubstituted benzenes, respectively. For example, the names 1,2-dimethylbenzene and ortho-dimethylbenzene are synonymous.

The terms "heterocyclyl", "heteroaryl", or "heterocyclic group" are art-recognized and refer to 3- to about 10-membered ring structures, alternatively 3- to about 7-membered rings, whose ring structures include one to four heteroatoms. Heterocycles may also be polycycles. Heterocyclyl groups include, for example, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, lactams such as azetidinones and pyrrolidinones, sultams, sultones, and the like. The heterocyclic ring may be substituted at one or more positions with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —$CF_3$, —CN, or the like.

The terms "polycyclyl" or "polycyclic group" are art-recognized and refer to two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle may be substituted with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —$CF_3$, —CN, or the like.

The term "carbocycle" is art-recognized and refers to an aromatic or non-aromatic ring in which each atom of the ring is carbon.

The term "nitro" is art-recognized and refers to —$NO_2$; the term "halogen" is art-recognized and refers to —F, —Cl, —Br or —I; the term "sulfhydryl" is art-recognized and refers to —SH; the term "hydroxyl" means —OH; and the term "sulfonyl" is art-recognized and refers to —$SO_2^-$. "Halide" designates the corresponding anion of the halogens, and "pseudohalide" has the definition set forth on page 560 of "Advanced Inorganic Chemistry" by Cotton and Wilkinson.

The terms "amine" and "amino" are art-recognized and refer to both unsubstituted and substituted amines, e.g., a moiety that may be represented by the general formulas:

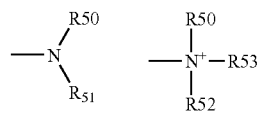

wherein R50, R51, R52 and R53 each independently represent a hydrogen, an alkyl, an alkenyl, —$(CH_2)_m$—R61, or R50 and R51 or R52, taken together with the N atom to which they are attached complete a heterocycle having from 4 to 8 atoms in the ring structure; R61 represents an aryl, a cycloalkyl, a cycloalkenyl, a heterocycle or a polycycle; and m is zero or an integer in the range of 1 to 8. In other embodiments, R50 and R51 (and optionally R52) each independently represent a hydrogen, an alkyl, an alkenyl, or —$(CH_2)_m$—R61. Thus, the term "alkylamine" includes an amine group, as defined above, having a substituted or unsubstituted alkyl attached thereto, i.e., at least one of R50 and R51 is an alkyl group.

The term "acylamino" is art-recognized and refers to a moiety that may be represented by the general formula:

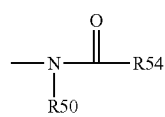

wherein R50 is as defined above, and R54 represents a hydrogen, an alkyl, an alkenyl or —$(CH_2)_m$—R61, where m and R61 are as defined above.

The term "amido" is art recognized as an amino-substituted carbonyl and includes a moiety that may be represented by the general formula:

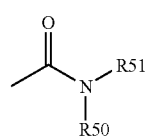

wherein R50 and R51 are as defined above. Certain embodiments of the amide in the present invention will not include imides which may be unstable.

The term "alkylthio" refers to an alkyl group, as defined above, having a sulfur radical attached thereto. In certain embodiments, the "alkylthio" moiety is represented by one of —S-alkyl, —S-alkenyl, —S-alkynyl, and —S—(CH$_2$)$_m$—R61, wherein m and R61 are defined above. Representative alkylthio groups include methylthio, ethyl thio, and the like.

The term "carboxyl" is art recognized and includes such moieties as may be represented by the general formulas:

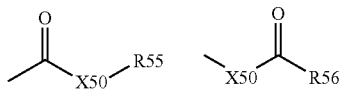

wherein X50 is a bond or represents an oxygen or a sulfur, and R55 and R56 represents a hydrogen, an alkyl, an alkenyl, —(CH$_2$)$_m$—R61 or a pharmaceutically acceptable salt, R56 represents a hydrogen, an alkyl, an alkenyl or —(CH$_2$)$_m$—R61, where m and R61 are defined above. Where X50 is an oxygen and R55 or R56 is not hydrogen, the formula represents an "ester". Where X50 is an oxygen, and R55 is as defined above, the moiety is referred to herein as a carboxyl group, and particularly when R55 is a hydrogen, the formula represents a "carboxylic acid". Where X50 is an oxygen, and R56 is hydrogen, the formula represents a "formate". In general, where the oxygen atom of the above formula is replaced by sulfur, the formula represents a "thiolcarbonyl" group. Where X50 is a sulfur and R55 or R56 is not hydrogen, the formula represents a "thiolester." Where X50 is a sulfur and R55 is hydrogen, the formula represents a "thiolcarboxylic acid." Where X50 is a sulfur and R56 is hydrogen, the formula represents a "thiolformate." On the other hand, where X50 is a bond, and R55 is not hydrogen, the above formula represents a "ketone" group. Where X50 is a bond, and R55 is hydrogen, the above formula represents an "aldehyde" group.

The term "carbamoyl" refers to —O(C=O)NRR', where R and R' are independently H, aliphatic groups, aryl groups or heteroaryl groups.

The term "oxo" refers to a carbonyl oxygen (=O).

The terms "oxime" and "oxime ether" are art-recognized and refer to moieties that may be represented by the general formula:

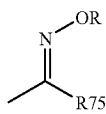

wherein R75 is hydrogen, alkyl, cycloalkyl, alkenyl, alkynyl, aryl, aralkyl, or —(CH$_2$)$_m$—R61. The moiety is an "oxime" when R is H; and it is an "oxime ether" when R is alkyl, cycloalkyl, alkenyl, alkynyl, aryl, aralkyl, or —(CH$_2$)$_m$—R61.

The terms "alkoxyl" or "alkoxy" are art-recognized and refer to an alkyl group, as defined above, having an oxygen radical attached thereto. Representative alkoxyl groups include methoxy, ethoxy, propyloxy, tert-butoxy and the like. An "ether" is two hydrocarbons covalently linked by an oxygen. Accordingly, the substituent of an alkyl that renders that alkyl an ether is or resembles an alkoxyl, such as may be represented by one of —O-alkyl, —O-alkenyl, —O-alkynyl, —O—(CH$_2$)$_m$—R61, where m and R61 are described above.

The term "sulfonate" is art recognized and refers to a moiety that may be represented by the general formula:

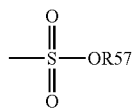

in which R57 is an electron pair, hydrogen, alkyl, cycloalkyl, or aryl.

The term "sulfate" is art recognized and includes a moiety that may be represented by the general formula:

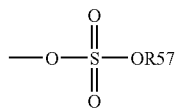

in which R57 is as defined above.

The term "sulfonamido" is art recognized and includes a moiety that may be represented by the general formula:

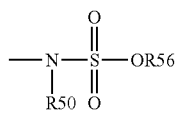

in which R50 and R56 are as defined above.

The term "sulfamoyl" is art-recognized and refers to a moiety that may be represented by the general formula:

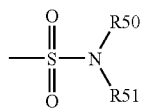

in which R50 and R51 are as defined above.

The term "sulfonyl" is art-recognized and refers to a moiety that may be represented by the general formula:

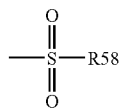

in which R58 is one of the following: hydrogen, alkyl, alkenyl, alkynyl, cycloalkyl, heterocyclyl, aryl or heteroaryl.

The term "sulfoxido" is art-recognized and refers to a moiety that may be represented by the general formula:

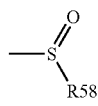

in which R58 is defined above.

The term "phosphoryl" is art-recognized and may in general be represented by the formula:

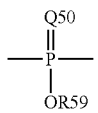

wherein Q50 represents S or O, and R59 represents hydrogen, a lower alkyl or an aryl. When used to substitute, e.g., an alkyl, the phosphoryl group of the phosphorylalkyl may be represented by the general formulas:

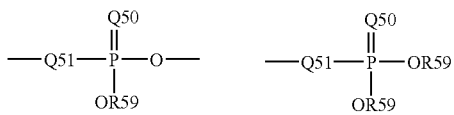

wherein Q50 and R59, each independently, are defined above, and Q51 represents O, S or N. When Q50 is S, the phosphoryl moiety is a "phosphorothioate".

The term "phosphoramidite" is art-recognized and may be represented in the general formulas:

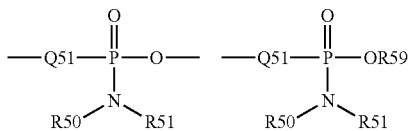

wherein Q51, R50, R51 and R59 are as defined above.

The term "phosphonamidite" is art-recognized and may be represented in the general formulas:

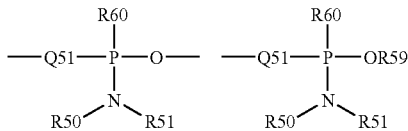

wherein Q51, R50, R51 and R59 are as defined above, and R60 represents a lower alkyl or an aryl.

Analogous substitutions may be made to alkenyl and alkynyl groups to produce, for example, aminoalkenyls, aminoalkynyls, amidoalkenyls, amidoalkynyls, iminoalkenyls, iminoalkynyls, thioalkenyls, thioalkynyls, carbonyl-substituted alkenyls or alkynyls.

The definition of each expression, e.g. alkyl, m, n, and the like, when it occurs more than once in any structure, is intended to be independent of its definition elsewhere in the same structure.

The term "selenoalkyl" is art-recognized and refers to an alkyl group having a substituted seleno group attached thereto. Exemplary "selenoethers" which may be substituted on the alkyl are selected from one of —Se-alkyl, —Se-alkenyl, —Se-alkynyl, and —Se—$(CH_2)_m$—R61, m and R61 being defined above.

The abbreviations Me, Et, Ph, Tf, Nf, Ts, and Ms represent methyl, ethyl, phenyl, trifluoromethanesulfonyl, nonafluorobutanesulfonyl, p-toluenesulfonyl and methanesulfonyl, respectively. A more comprehensive list of the abbreviations utilized by organic chemists of ordinary skill in the art appears in the first issue of each volume of the Journal of Organic Chemistry; this list is typically presented in a table entitled Standard List of Abbreviations.

It will be understood that "substitution" or "substituted with" includes the implicit proviso that such substitution is in accordance with permitted valence of the substituted atom and the substituent, and that the substitution results in a stable compound, e.g., which does not spontaneously undergo transformation such as by rearrangement, cyclization, elimination, or other reaction.

The term "substituted" is also contemplated to include all permissible substituents of organic compounds. In a broad aspect, the permissible substituents include acyclic and cyclic, branched and unbranched, carbocyclic and heterocyclic, aromatic and nonaromatic substituents of organic compounds. Illustrative substituents include, for example, those described herein above. The permissible substituents may be one or more and the same or different for appropriate organic compounds. For purposes of this invention, the heteroatoms such as nitrogen may have hydrogen substituents and/or any permissible substituents of organic compounds described herein which satisfy the valences of the heteroatoms. This invention is not intended to be limited in any manner by the permissible substituents of organic compounds.

As used here "-alkyl" refers to a radical such as —$CH_2CH_3$, while "-alkyl-" refers to a diradical such as —$CH_2CH_2$—.

For purposes of this invention, the chemical elements are identified in accordance with the Periodic Table of the Elements, CAS version, "Handbook of Chemistry and Physics", 67th Ed., 1986-87, inside cover.

The phrase "polydispersity index" refers to the ratio of the "weight average molecular weight" to the "number average molecular weight" for a particular polymer; it reflects the distribution of individual molecular weights in a polymer sample.

The phrase "weight average molecular weight" refers to a particular measure of the molecular weight of a polymer. The weight average molecular weight is calculated as follows: determine the molecular weight of a number of polymer molecules; add the squares of these weights; and then divide by the total weight of the molecules.

The phrase "number average molecular weight" refers to a particular measure of the molecular weight of a polymer. The number average molecular weight is the common average of the molecular weights of the individual polymer molecules. It is determined by measuring the molecular weight of n polymer molecules, summing the weights, and dividing by n.

Polymerization of EDOT. The oxidation of 3,4-ethylenedioxythiophene (EDOT) to form PEDOT is analogous to the oxidative polymerization of pyrrole, which has been described with a mechanism proposed by Diaz and shown in FIG. 1A. [S. Sadki, P. Schottland, N. Brodie, G. Sabouraud, Chemical Society Reviews 29, 283 (2000); and E. M. Genies, G. Bidan, A. F. Diaz, Journal of Electroanalytical Chemistry 149, 101 (1983).] The first step is the oxidation of EDOT, which generates a radical cation that has several resonance forms. The combination of two of these radicals and subsequent deprotonation form a neutral dimer. Substitution of the EDOT thiophene ring at the 3,4-positions blocks β-coupling, allowing new bonds only at the 2,5-positions. The alternating single and double bonds of the dimer give π-conjugated or delocalized electrons, making it easier to remove an electron from the dimer relative to the monomer. In other words, the dimer has a lower oxidation potential than the monomer. The dimer can be oxidized to form another positively charged radical that undergoes coupling and deprotonation with other monomeric or oligomeric cations. Eventually, chains of neutral PEDOT with alternating single and double bonds are formed.

The neutral PEDOT polymer is further oxidized to create a positive charge along the backbone every three or four chain segments. A "dopant" anion ionically binds to the polymer and balances the charge. The oxidized form of PEDOT shown in FIG. 1B is the conducting form of the polymer. Neutral PEDOT has a dark blue/purple color and the doped form is very light blue.

Figure 2:
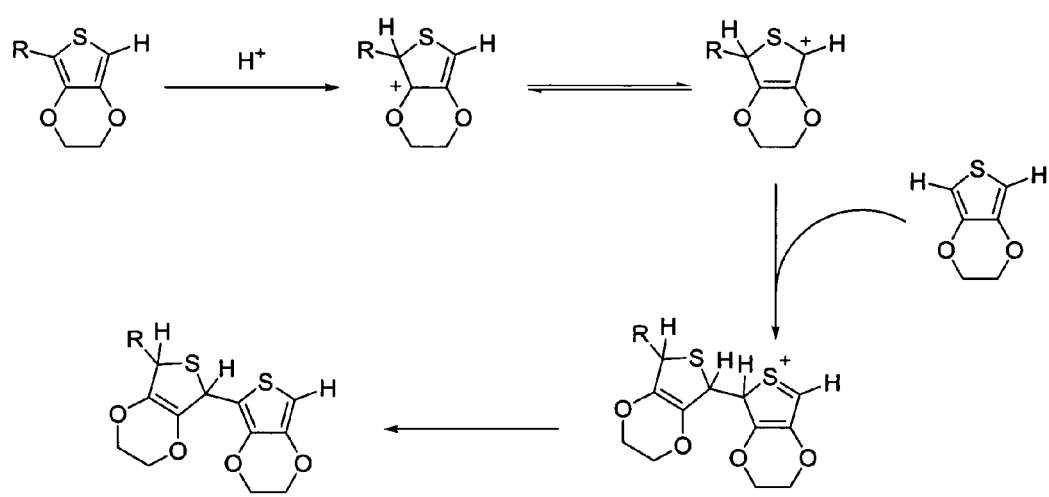
FIG. 2(A) depicts an acid initiated coupling of 3,4-ethylenedioxythiophene (EDOT), resulting in an non-conjugated polymer (e.g., "R" may be a hydrogen, EDOT or PEDOT); and (B) depicts a trimer with broken conjugation resulting from polymerization under highly acidic conditions.
Figure 2:
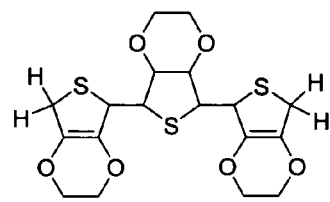

The acidic strength of the reaction environment is one aspect of the mechanism to be considered, because it can have a number of effects on the polymerization conditions, including the oxidation potential of the oxidant, which can be decreased with the addition of a base. Some acidification of the reaction mixture generally speeds the rate of polymerization through an acid-initiated coupling mechanism, shown in FIG. 2A, which contributes to additional chain growth.

One caveat of acid-initiated coupling is that the resulting polymer is not conjugated and will not be electrically conducting without subsequent oxidation. If the acidic strength is too high, it is even possible to saturate the 3,4-positions of a reacting EDOT radical, resulting in a trimer with broken conjugation, shown in FIG. 2B, quenching electrical conductivity. [T. F. Otero, J. Rodriguez, Electrochimica Acta 39, 245 (1994).]

Evidence has also been presented that very acidic conditions can break the dioxy bridge on the EDOT ring leading to imperfections that reduce conductivity. [B. Winther-Jensen, K. West, Macromolecules 37, 4538 (2004).] Adding pyridine as a base to the system to achieve an acidic strength strong enough to maintain the oxidation potential of the oxidant, but not strong enough to cause bond cleavage of the monomer, yielded PEDOT films with conductivities reported to be as high as 1000 S/cm.

Chemical Vapor Deposition (CVD). CVD generally takes place in a reactor. Precursor molecules, consisting of a chemical metal-containing oxidant and a monomer species, are fed into the reactor. This process can take place at a range of pressures from atmospheric pressure to low vacuum. In certain embodiments the pressure is about 760 torr; in other embodiments, the pressure is about 300 torr; in other embodiments, the pressure is about 30 torr; in other embodiments, the pressure is about 3000 mtorr; in yet other embodiments, the pressure is about 300 mtorr. Chemical metal-containing oxidant species are extremely heavy, but can be sublimed onto a substrate surface using a-carrier gas and a heated, porous crucible installed inside the reactor directly above the sample stage. The oxidant source can also be installed on the exterior of the vacuum chamber. Evaporation of the oxidant can also take place in a resistively heated container inside the reaction chamber. In certain embodiments, evaporation of the oxidant takes place in a resistively heated container inside the reaction chamber underneath the substrate surface to be coated. In certain embodiments, the monomer species may be delivered from a source external to the reactor. The metal-containing oxidant forms a thin, conformational layer on the substrate surface, which reacts with monomer molecules as they adsorb. An acid-catalyzed side reaction leading to broken monomer bonds and non-conjugated oligomers inhibits the formation of conjugated, electrically active polymer. These side reactions may be reduced using one or more the following techniques: introducing a base, such as pyridine, to react with any acid that is formed in situ; heating the substrate to temperatures above about 60° C., 70° C., 80° C. or 90° C., for example, to accelerate evaporation of the acid as it is formed; and biasing the substrate with a positive charge using a DC power supply to favor the oxidation of monomeric and oligomeric species adsorbed on the substrate. Biasing also provided directionality to charged oligomers during polymer chain growth. The ordering of the polymer chains that results is expected to contribute to higher electrical conductivities.

The deposited film then may be heated, sometimes under vacuum (e.g., −15 mmHg, −30 mmHg, or −45 mmHg), to remove unreacted monomer. Rinsing the dried film in a solvent like methanol or water can remove reacted metal-containing oxidant from the film, in some cases changing the color from hazy yellow to a clear sky blue hue. Rinsing the dried film in a solution of "dopant" ionic salts, such as $NOPF_6$ in acetonitrile, promotes the oxidized form of the conducting polymer by balancing positive charges that are induced along the polymer chain with anions from the salt.

Methods of the Invention. One aspect of the invention relates to a method of forming a conducting polymer coating on a surface, comprising the steps of: contacting said surface with a gaseous metal-containing oxidant, thereby forming an oxidant-enriched surface; optionally contacting said oxidant-enriched surface with a gaseous base; and contacting said oxidant-enriched surface with a gaseous monomer, wherein said gaseous monomer is selected from the group consisting of optionally substituted thiophenes, pyrroles, and anilines, thereby forming a conducting polymer coated surface.

Another aspect of the invention relates to a method of forming a conducting polymer coating on a surface, comprising the steps of: contacting said surface with a gaseous oxidant, thereby forming an oxidant-enriched surface; optionally contacting said oxidant-enriched surface with a gaseous base; and contacting said oxidant-enriched surface with a gaseous monomer, wherein said gaseous monomer is an optionally substituted thiophene, thereby forming a conducting polymer coated surface.

In certain embodiments, the present invention relates to an aforementioned method, wherein said gaseous metal-containing oxidant is selected from the group consisting of iron (III) chloride, iron(III) toslyate, potassium iodate, potassium chromate, ammonium sulfate and tetrabutylammonium persulfate.

In certain embodiments, a gaseous precursor, such as an epoxide, may be thermally activated with the use of a hot filament to provide an initiator for the oxidative polymerization of the conducting polymer.

In certain embodiments, the present invention relates to an aforementioned method, wherein said gaseous metal-containing oxidant is iron(III) chloride.

In certain embodiments, the present invention relates to an aforementioned method, wherein said gaseous metal-containing oxidant has an oxidation potential between about 0.5 V and about 1.0 V.

In certain embodiments, the present invention relates to an aforementioned method, wherein said gaseous metal-containing oxidant has an oxidation potential of about 0.75 V.

In certain embodiments, the present invention relates to an aforementioned method, wherein said gaseous base is an optionally substituted pyridine.

In certain embodiments, the present invention relates to an aforementioned method, further comprising the step of washing said conducting polymer coated surface with a solvent.

In certain embodiments, the present invention relates to an aforementioned method, wherein said solvent is selected from the group consisting of water, methanol, ethanol, isopropanol, acetonitrile and mixtures thereof.

In certain embodiments, the present invention relates to an aforementioned method, wherein said solvent is methanol.

In certain embodiments, the present invention relates to an aforementioned method, further comprising the step of contacting said conducting polymer coated surface with a dopant anion.

In certain embodiments, the present invention relates to an aforementioned method, wherein said dopant anion is selected from the group consisting of chloride, bromide, iodide, fluoride, phosphate and sulfonate.

In certain embodiments, the present invention relates to an aforementioned method, wherein said dopant anion is nitrosonium hexafluorophosphate.

In certain embodiments, the present invention relates to an aforementioned method, further comprising the step of warming said conducting polymer coated surface under vacuum, thereby forming a substantially dried conducting polymer.

In certain embodiments, the present invention relates to an aforementioned method, wherein said gaseous monomer is an optionally substituted thiophene represented by formula I:

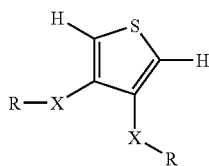

I wherein, independently for each occurrence, X is —O—, —S— or —N($R^A$)—; R is -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$; $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$; $R^B$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to an aforementioned method, wherein X is —O—.

In certain embodiments, the present invention relates to an aforementioned method, wherein R is alkyl.

In certain embodiments, the present invention relates to an aforementioned method, wherein X is —O—; and R is alkyl.

In certain embodiments, the present invention relates to an aforementioned method, wherein said gaseous monomer is an optionally substituted thiophene represented by formula II:

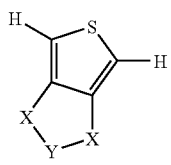

II wherein, independently for each occurrence, X is —O—, —S— or —N($R^A$)—; Y is —C($R^B$)$_2$—, —C($R^B$)$_2$C($R^B$)$_2$— or —C($R^B$)$_2$C($R^B$)$_2$C($R^B$)$_2$—; $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$; $R^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$; $R^C$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to an aforementioned method, wherein X is —O—.

In certain embodiments, the present invention relates to an aforementioned method, wherein Y is —C($R^B$)$_2$C($R^B$)$_2$—.

In certain embodiments, the present invention relates to an aforementioned method, wherein X is —O—; and Y is —C($R^B$)$_2$C($R^B$)$_2$—.

In certain embodiments, the present invention relates to an aforementioned method, wherein X is —O—; Y is —C($R^B$)$_2$C($R^B$)$_2$—; and $R^B$ is hydrogen or alkyl.

In certain embodiments, the present invention relates to an aforementioned method, wherein X is —O—; Y is —C($R^B$)$_2$C($R^B$)$_2$—; and $R^B$ is hydrogen.

In certain embodiments, the present invention relates to an aforementioned method, wherein X is —O—; Y is —C($R^B$)$_2$C($R^B$)$_2$—; $R^B$ is hydrogen; and said metal-containing oxidant is iron(III) chloride.

In certain embodiments, the present invention relates to an aforementioned method, wherein X is —O—; Y is —C($R^B$)$_2$C($R^B$)$_2$—; $R^B$ is hydrogen; said metal-containing oxidant is iron(III) chloride; and said gaseous base is present and is pyridine.

One aspect of the invention relates to a method of forming a conducting polymer coating on a surface, comprising the steps of: contacting said surface with a gaseous oxidant, thereby forming an oxidant-enriched surface; optionally contacting said oxidant-enriched surface with a gaseous base; and contacting said oxidant-enriched surface with a gaseous monomer, wherein said gaseous monomer is 3,4 ethylenedioxythiophene, thereby forming a conducting polymer coated surface.

In certain embodiments, the present invention relates to an aforementioned method, wherein said gaseous base is an optionally substituted pyridine.

In certain embodiments, the present invention relates to an aforementioned method, wherein said surface is paper, ceramic, carbon, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-tex®, Marlex®, expanded polytetrafluoroethylene (e-PTFE), low density polyethylene (LDPE), high density polyethylene (HDPE), polypropylene (PP), and poly(ethylene terephthalate) (PET).

In certain embodiments, the present invention relates to an aforementioned method, said coating is of a uniform thickness (i.e., said thickness does not vary more than 10% over the surface of the article; or by more than 5% over the surface of the article; or by more than 1% over the surface of the article.)

In certain embodiments, the present invention relates to an aforementioned method, wherein said polymer coating has a mass per surface area of less than about 500 µg/cm$^2$.

In certain embodiments, the present invention relates to an aforementioned method, wherein said polymer coating has a mass per surface area of less than about 100 µg/cm$^2$.

In certain embodiments, the present invention relates to an aforementioned method, wherein said polymer coating has a mass per surface area of less than about 50 µg/cm$^2$.

In certain embodiments, the present invention relates to an aforementioned method, wherein said polymer coating has a mass per surface area of less than about 10 µg/cm$^2$.

In certain embodiments, the present invention relates to an aforementioned method, wherein said polymer coating has a mass per surface area of less than about 5 µg/cm$^2$.

The required mass per surface area depends on the specific surface area of the substrate to be coated. A smooth flat substrate, 1 cm$^2$ in area requires coverage of only 1 cm$^2$ of area and thus the specific surface area of 1 cm$^2$/cm$^2$. However, a 1 cm$^2$ section of fabric has a specific surface area greater than 1 because each surface-accessible fiber of the fabric must be coated. The gaseous reactants of the inventive processes are able to penetrate into the fabric and coat these internal surfaces. The specific surface area will depend on the packing density of the fibers and total thickness of the fabric. The thickness (cm) of the coating multiplied by the specific surface area (cm$^2$/cm$^2$) of the fabric and the density of the coating (g/cm$^3$) will yield the mass per surface area (g/cm$^2$).

Figure 4:
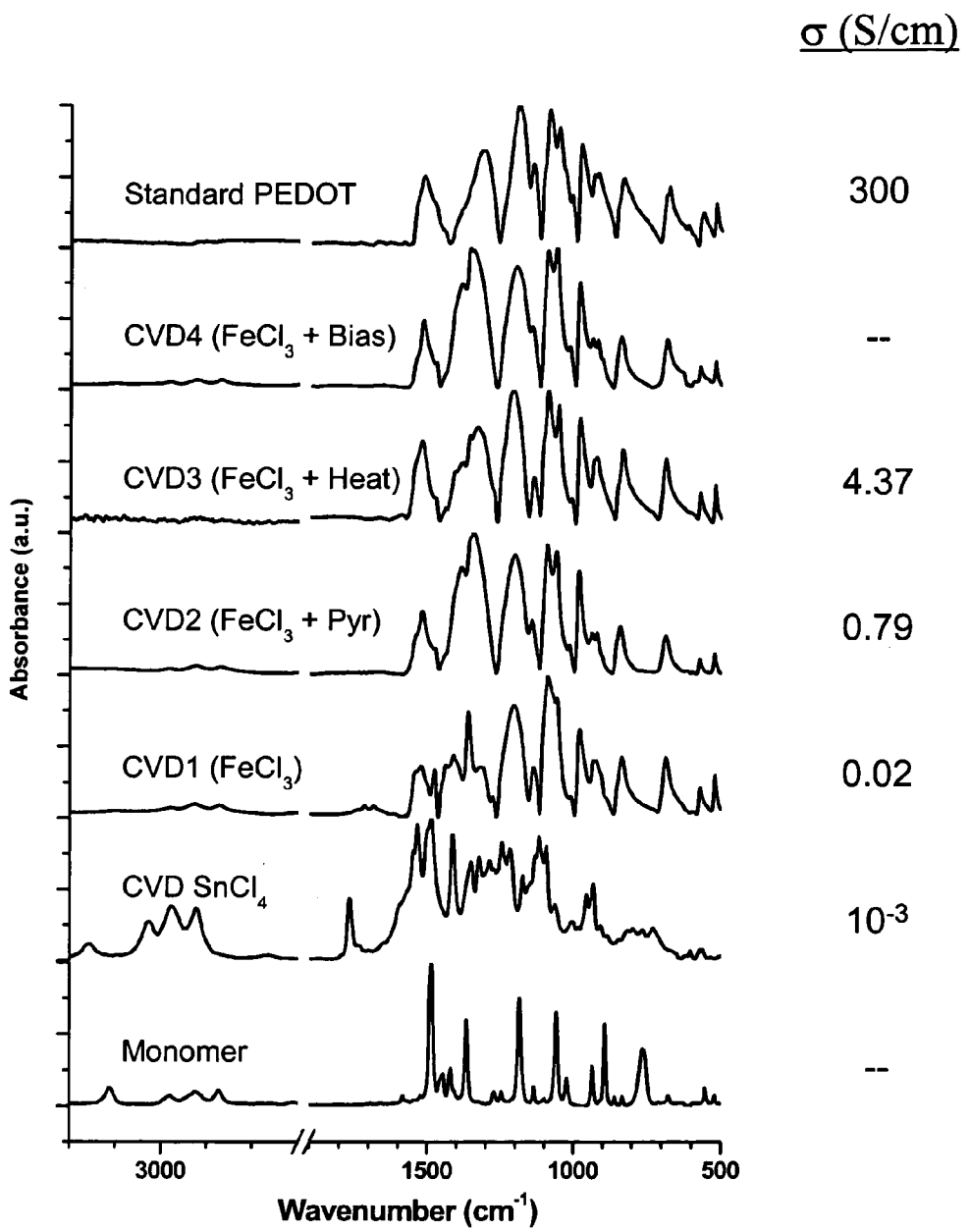
FIG. 4 depicts FTIR spectra and conductivity values for CVD PEDOT and standard PEDOT films.
Figure 5:
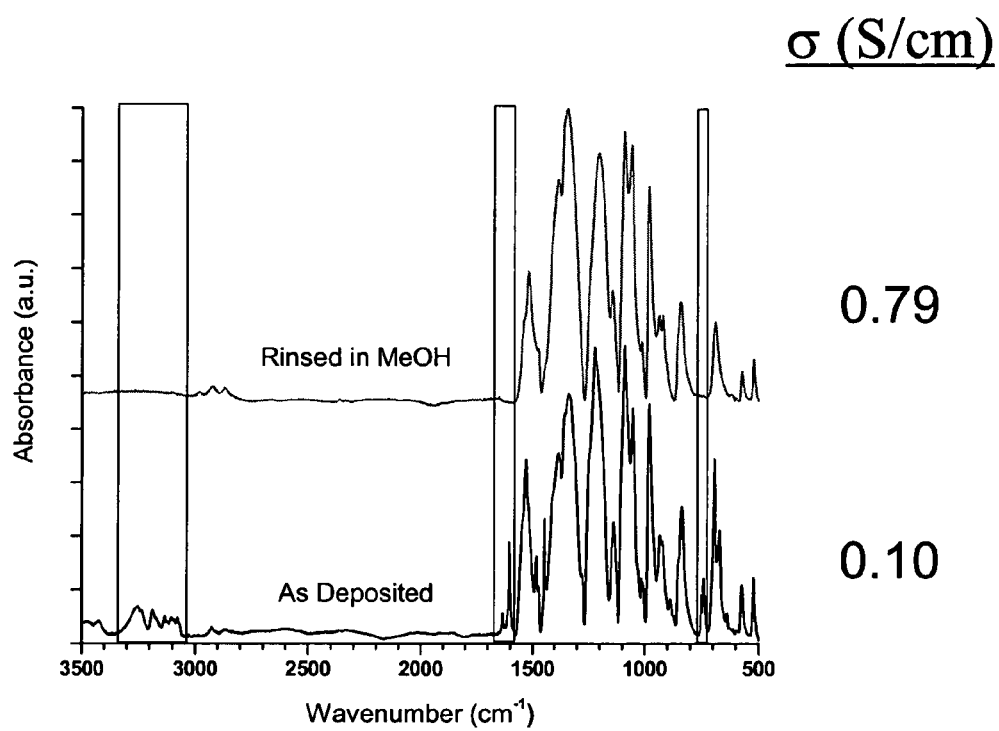
FIG. 5 depicts a comparison of FTIR spectra of PEDOT polymerized in the presence of puridine, before (bottom) and after (top) rinsing with methanol.

Infrared Spectra of PEDOT Films. FTIR spectra showing the bonding characteristics of a succession of CVD PEDOT films (Example 1) are shown in FIG. 4. For reference, the bottom spectrum is the EDOT monomer and the top spectrum is a standard PEDOT film made using a Bayer solution-based formula (Example 2). All of the films in FIG. 4 were rinsed in methanol after deposition.

PEDOT deposited with CVD using FeCl$_3$ as the oxidant exhibited conductivities ranging between 10$^{-2}$ and 10$^1$ S/cm. Although 300 S/cm is possible using in-situ polymerization of BAYTRON M, the CVD films share characteristics peaks in the infrared spectra with the oxidized, π-conjugated PEDOT material. Coupling of the monomers at the 2,5-positions of the thiophene ring to form the polymer corresponds to a disappearance of the C—H stretch at 3100 cm$^{-1}$, which is observed in both PEDOT standard and FeCl$_3$ CVD films. The stretches between 2800 and 3000 cm$^{-1}$ are from the C—H bonds on the ethylene dioxy bridge and should be observed in films made by traditional and the inventive methods. However, those stretches are obscured in the polymerized films and completely hidden in the standard sample. Electron delocalization evidently broadens the ring stretches between 500 and 1500 cm$^{-1}$. This is probably the combined effect of the averaging of many bond types in the resonant doped structure of oxidized PEDOT as well as multiple oligomer lengths incorporated in the film. GPC tests to quantify the distribution of oligomers that are present were not possible since the films are insoluble in multiple solvents, even with sonication.

An initial CVD film using FeCl$_3$ to oxidize EDOT is labeled CVD1. Its spectrum shows a small carbonyl peak at 1700 cm$^{-1}$, which suggests the existence of broken bonds in the monomer ether bridge. This has been reported to occur when the oxidation potential of the oxidant is too high or when the acid strength of the polymerization environment is too strong. As an extreme case, the spectrum of a CVD film using SnCl$_4$ as the oxidizing agent is included in FIG. 4 to illustrate a sharp peak at 1700 cm$^{-1}$ indicating an abundance of carbonyl groups. Sn$^{4+}$ has a standard reduction potential of 0.154 V versus 0.769 V for Fe$^{3+}$. The films exhibiting the carbonyl peak also lack many of the spectral characteristics between 1500 and 500 cm$^{-1}$ that are associated with conjugated rings and their conductivities are correspondingly low.

The use of pyridine to achieve base-inhibited polymerization of PEDOT films with electrical conductivities as high as 1000 S/cm has been reported. [B. Winther-Jensen, K. West, Macromolecules 37, 4538 (2004).] Following this example, pyridine vapors were fed into the CVD chamber with the monomer after subliming the oxidizing layer onto the substrate. The carbonyl stretch is absent from the resulting FTIR spectrum labeled CVD2 in FIG. 4. Also, the ring stretches more closely resemble the conjugated standard PEDOT film and the conductivity improved an order of magnitude to 0.7 S/cm. A comparison of FTIR spectra for CVD2 after deposition with pyridine and then after rinsing the film in methanol provides some insight into the base-inhibited mechanism.

After polymerization of EDOT on the substrate, pyridine remains in the film, but washes out completely in methanol presenting the possibility that it has reacted and is present as a non-volatile pyridinium salt. Pyridine is sometimes used by organic chemists as a trapping agent for HCl due to the favorable formation of pyridinium salt. Acid has not been explicitly added to the deposition of CVD2, but it is reasonable to assume that some HCl is produced due to the deprotonation steps during PEDOT polymerization and the presence of Cl$^-$ ions from the reacted oxidant. Introducing pyridine to the system could eliminate HCl in the system that may have contributed to carbonyl formation in CVD1. Removal of strong acid from the system as it is formed might also push the deprotonation of coupled oligomers, increasing the likelihood that chains will become fully conjugated, leading to better film conductivities. Reaction of pyridine and HCl would also generate more Cl$^-$ ions available for doping. Whether the pyridine acts to reduce the acidic strength of the reaction mixture resulting in a lower oxidation potential of the oxidant, as suggested by Winther-Jenkens et al, or serves as a quencher for HCl byproduct, both functions should promote the formation of conducting PEDOT. Although the CVD2 film was washed in methanol, the unrinsed sample was also electrically active with a bulk conductivity of 0.1 S/cm.

Heating the sample stage during PEDOT deposition also yielded a film (CVD3) with spectral characteristics in good agreement with the standard PEDOT and led to an enhanced conductivity over 4 S/cm. Heating may promote conjugated material by volatilizing more HCl as it is formed or by contributing energy and accelerating the polymerization reactions. Biasing the sample stage with about +3 V during polymerization of the EDOT also resulted in a film (CVD4) with spectral features indicative of conducting PEDOT. The conductivity was not actually measured since biasing required the use of conducting substrates. Biasing may promote the formation of conjugated chains by adding an electrochemical pathway to the oxidation of EDOT and oligomers and by promoting a directional growth of polymer chains, resulting in a more ordered film.

One small feature that remains different between the CVD PEDOT films (CVD2, CVD3, and CVD4 in FIG. 4) compared to the standard PEDOT is a slightly more distinct shoulder at 1400 cm$^{-1}$. A closer look reveals that the broad absorption overlapping this shoulder peaks at a slightly higher wavenumbers for the CVD films. Based on the peak assignments, these two distinctions indicate a slight prevalence of 3-substituted thiophene moieties in the CVD films compared to the standard. The standard film is expected to have 3-substitution as well since that is where the diether bridge is attached to the monomer, but a stronger absorption in this region could indicate that the CVD films have less 2-substitution than the standard film owing to shorter polymer chains. This could explain the lower conductivities measured thus far for the CVD PEDOT films compared to standard PEDOT material.

Figure 6:
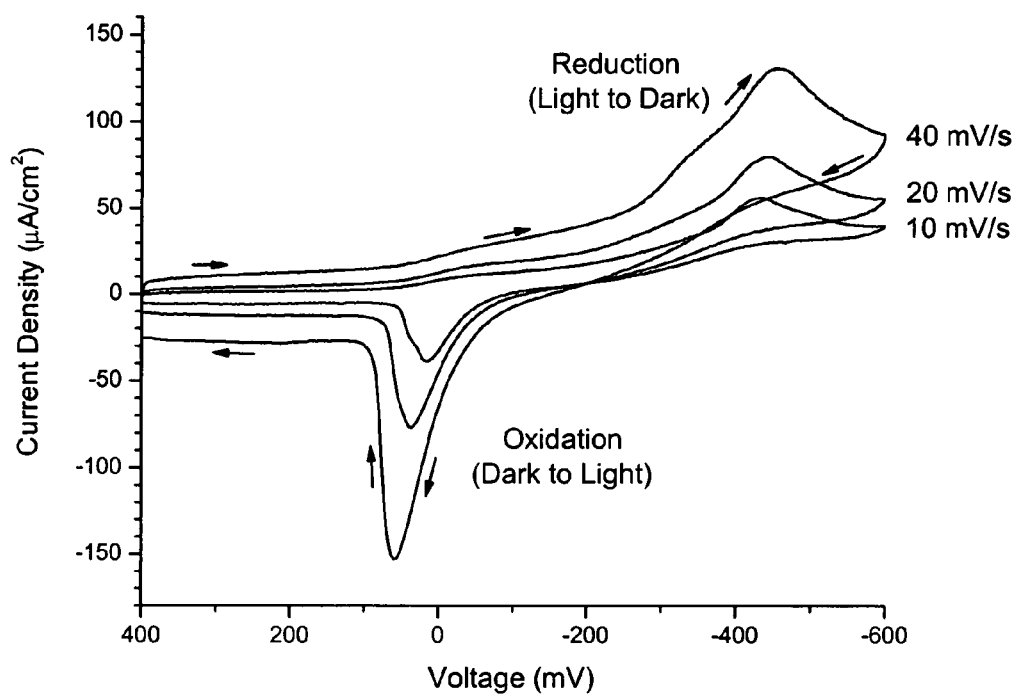
FIG. 6 depicts a cyclic voltammogram indicating that while PEDOT is reduced gradually, it oxidizes more suddenly. This characteristic stems from the conductivity of oxidized PEDOT compared to the non-conducting reduced form.

Cyclic Voltammetry of PEDOT Films. Cyclic voltammograms for a CVD PEDOT film are shown in FIG. 6 for three different sweep rates. For the 40 mV/s scan, the reduction peak appears at −460 mV and the oxidation peak is at 60 mV. Therefore, a potential of about 0.5 V is needed to fully drive the reaction between the oxidized and reduced forms of PEDOT, which is comparable to what has been observed with electrochemically deposited films. [Q. B. Pei, G. Zuccarello, M. Ahlskog, O. Inganas, Polymer 35, 1347 (1994); C. Kvarnstrom, H. Neugebauer, A. Ivaska, N. S. Sariciftci, Journal of Molecular Structure 521, 271 (2000); X. W. Chen, O. Inganas, Journal of Physical Chemistry 100, 15202 (1996); and C. Kvamstrom et al., Electrochimica Acta 44, 2739 (1999).] A peak separation of 0.5 V indicates that CVD PEDOT is a quasireversible system meaning that the electrochemical reaction in the material has electron-transfer kinetic limitations. Fully reversible systems have a peak separation of only 60 mV. [A. J. Bard, L. R. Faulkner, Electrochemical methods : fundamentals and applications (John Wiley, New York, ed. 2nd, 2001), pp. xxi, 833 p.] However, a potential of 0.5 V should be within the range of many electronic devices of interest.

Cyclic voltammetry can offer qualitative information for the oxidation and reduction mechanisms. Here, our resulting voltammogram shows a broad reduction peak with a shoulder and a sharp oxidation peak. This broad peak and shoulder is indicative of a mechanism more complicated than just a simple Faradaic reaction. The initial shoulder is attributed to the reduction of the initial layer of PEDOT just touching the ITO surface. This initial layer, once reduced, no longer conducts electrons and can act as a barrier for further reduction in the film. Consequently, the outlying film cannot be reduced until the potential is further increased, like overcoming an activation barrier. As more and more "layers" are reduced, the non-conducting barrier of neutral PEDOT increases, broadening the reduction peak. Finally, all the PEDOT is reduced and the potential is swept in the opposite direction. Oxidation gives a sharp peak and swift response because the first bit of PEDOT oxidized, that closest to the ITO, oxidizes to its conducting form which facilitates subsequent oxidation and acts as a viable conduit for electron transfer. This effect has also been observed in electrochemically deposited PEDOT films. [G. A. Sotzing, J. R. Reynolds, P. J. Steel, Chemistry of Materials 8, 882 (1996).]

Figure 7:
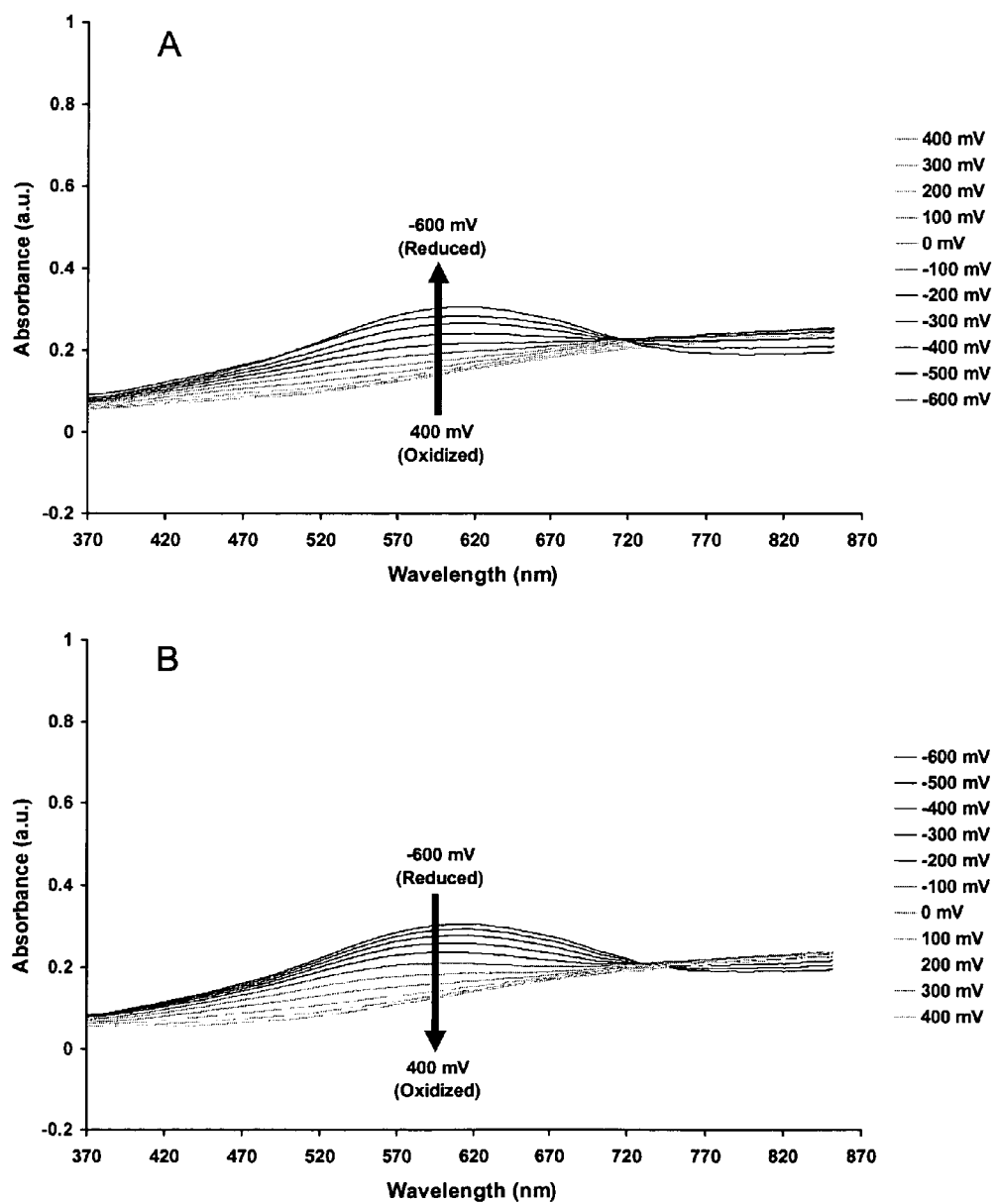
FIG. 7 depicts UVNis spectra indicating that CVD PEDOT has a maximum color contrast of 16.5% at a wavelength of about 585 nm.

UV/Vis Spectroscopy. UV/Vis spectra were collected for the same CVD PEDOT film to quantify its color change through the redox cycle. FIG. 7A shows the progression of the UV/Vis absorbance as the potential was stepped from 400 mV to −600 mV. The PEDOT film in its initial oxidized state is transparent and has a light sky blue color. After reduction at −600 mV, the film absorbs more strongly across the visible spectrum and takes on an opaque dark purple color. The maximum contrast change is 16.5%, which occurs at 585 cm. As the film is reoxidized by stepping the voltage in increments back to 400 mV (FIG. 7B), the absorbance spectrum returns to its original value. No visible transmission is lost in the film after the course of the redox cycle. Addition experiments are needed to determine the number of times the redox cycle can be repeated without deterioration in the contrast. The contrast can be increased with the co-deposition of other electrically active polymers, such as polyaniline, that absorb light in other regions of the visible spectrum.

Figure 8:
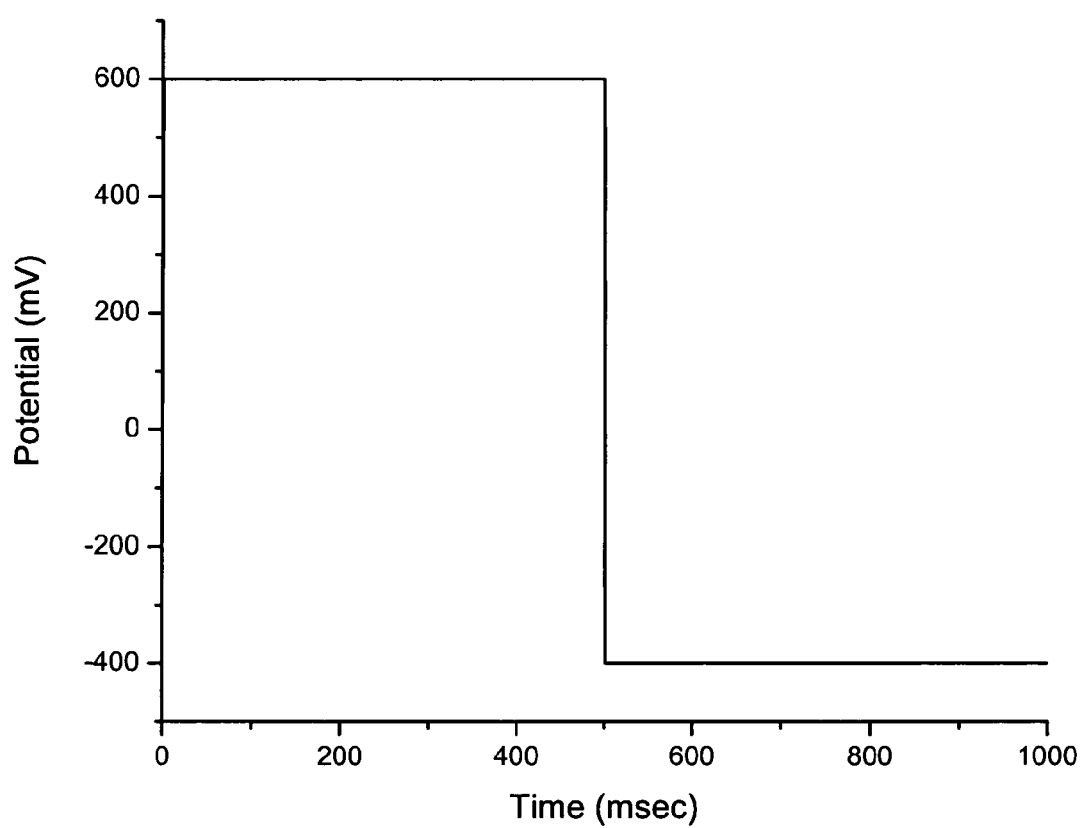
FIG. 8 depicts a square wave form with a step time of 500 msec and potential limits of 600 mV and −400 mV which was chosen for chrono amperommetry measurements.

Chrono amperommetry. Chrono amperommetry is a potential step experiment that offers information on the kinetics of redox systems. Chrono amperommetry was conducted on a CVD PEDOT film to gain knowledge about the reaction rates of the electrochromic response. A PEDOT film 50 nm thick on ITO was charged according to the double-step wave form shown in FIG. 8. The potentials for the first and second steps were chosen to be 600 mV and −400 mV, respectively, in order to take the film through a complete redox cycle according to the cyclic voltammogram in FIG. 6.

Figure 9:
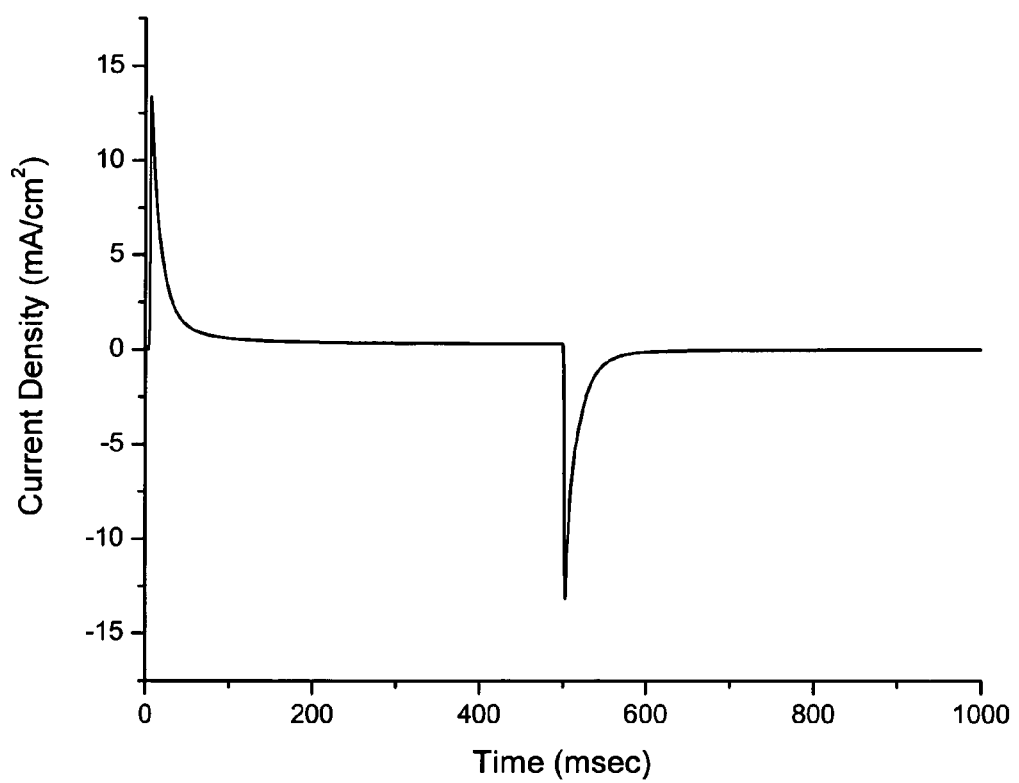
FIG. 9 depicts a graph of current density as a function of time, showing that a CVD PEDOT film 50 nm thick has a switching speed of about 50 msec for a 90% change and is as low as 27 msec for an 80% response.

Each step was held for 500 msec and the current passing into the film was measured. Data were collected every millisecond and are plotted versus time in FIG. 9. The CVD PEDOT film had a switching speed upon reduction of 49 msec for a 90% change and 31 msec for an 80% change. The film was able to oxidize slightly quicker and showed a switching speed of 39 msec for a 90% change and 27 msec for an 80% change. The switching times follow the trend seen in the cyclovoltammograms of a quicker oxidation process relative to reduction.

Figure 10:
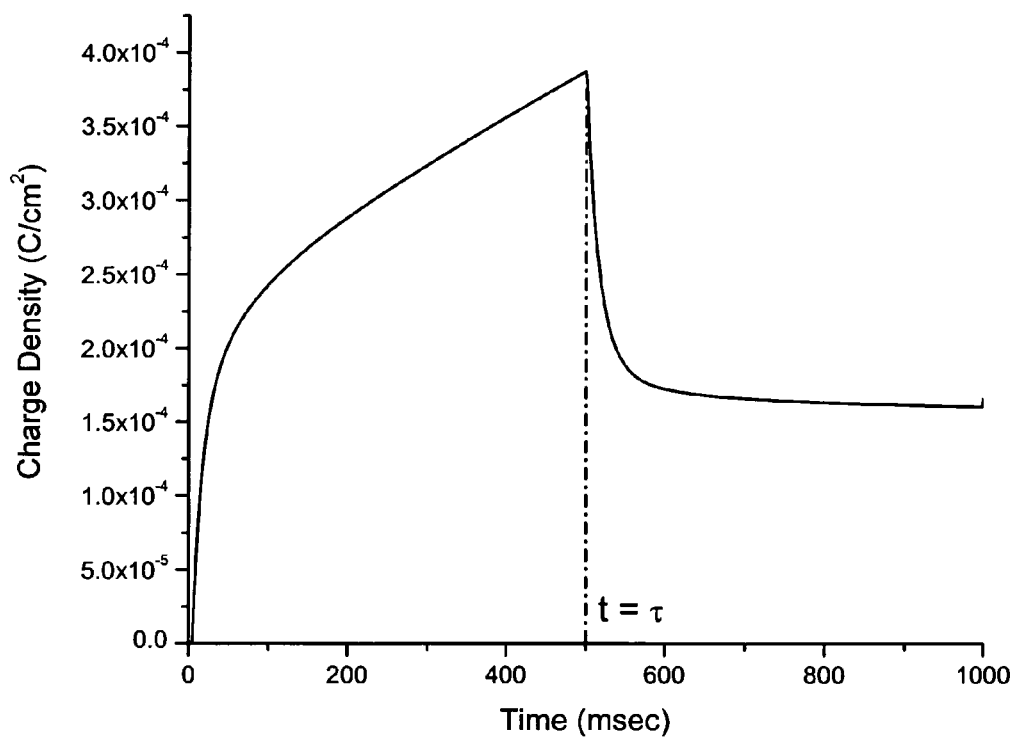
FIG. 10 depicts a graph of current density as a function of time, showing that the charge response of a CVD PEDOT film is proportional to $t^{1/2}$ indicating a diffusion-controlled process.
Figure 11:
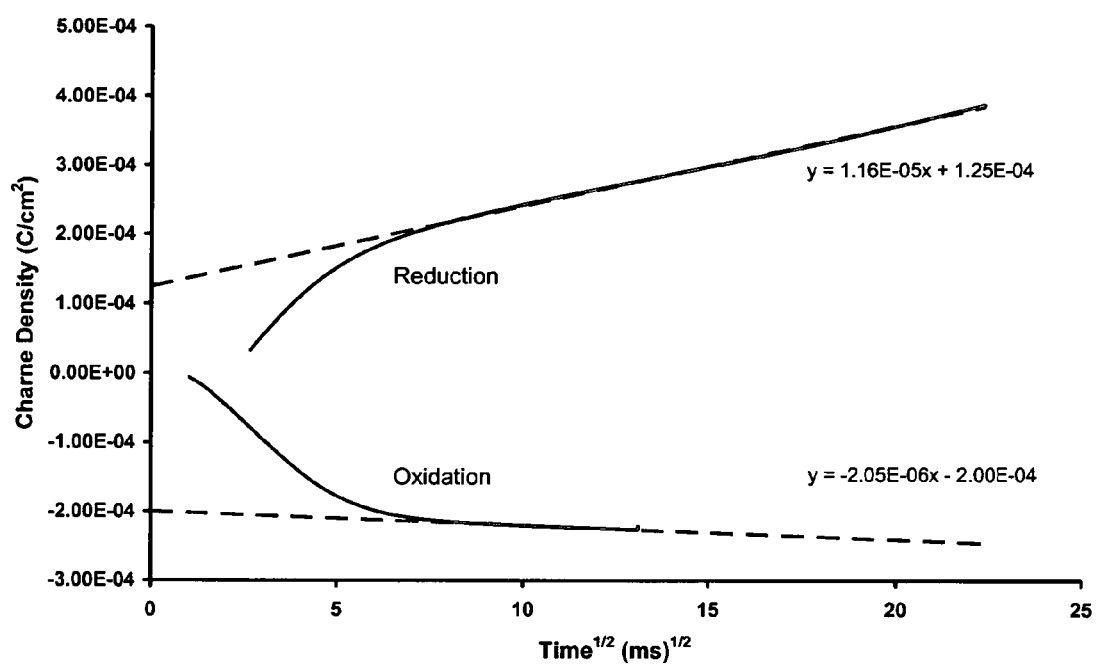
FIG. 11 depicts chrono-amperommetry data which is condensed into an Anson plot useful for calculating diffusion constants for charge transfer processes. CVD PEDOT has a diffusion coefficient on the order of $10^{-11}$ indicating that the process is controlled by ion diffusion in the film.
Figure 12:
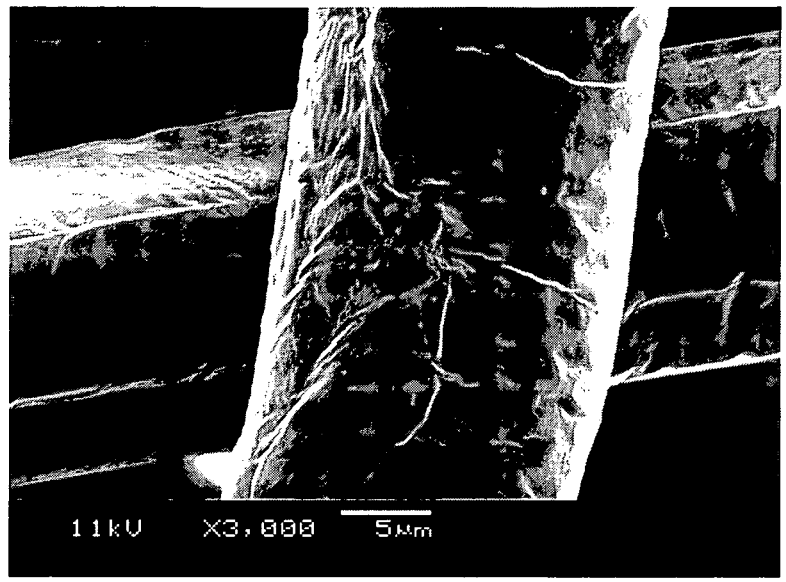
FIG. 12 depicts electron microscopy images of PEDOT on a paper towel: [a] shows the paper towel before being coated; and [b] shows the paper towel after being coated.
Figure 12:
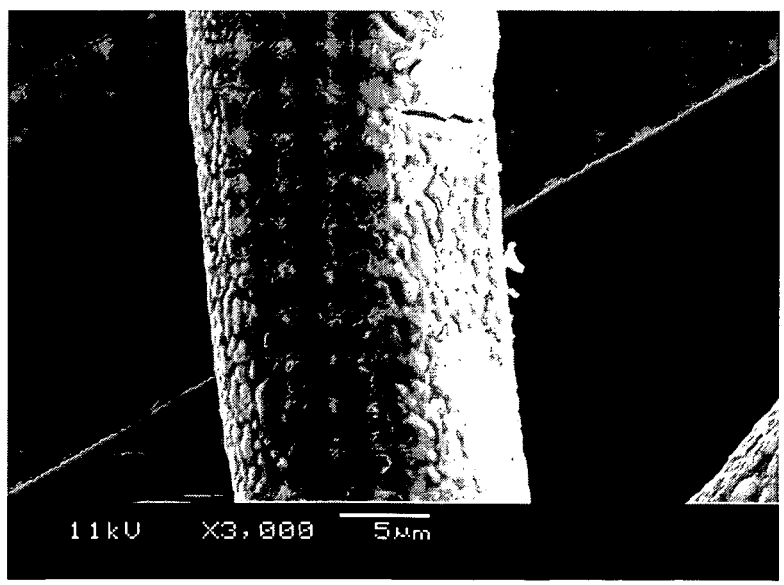

The charge response of materials can also be evaluated with data collected from a potential step experiment. [A. W. Bott, W. R. Heineman, Current Separations 20, 121 (2004).] The charge transfer in the film can be calculated by integrating the current over time according to Equation 1:

$$Q(t) = \int_{t_o}^{t} I dt \qquad (1)$$

where Q is charge, I is current, and $t_o$ is the starting time for the experiment. The charge response of the CVD PEDOT film is shown in FIG. 10. The charge is proportional to $t^{1/2}$ according to Equation 2, which is an integrated form of the Cottrell Equation:

$$Q_d = \frac{2nFAD_o^{1/2}C_o^*t^{1/2}}{\pi^{1/2}} \qquad (2)$$

where n is the charge difference between the reduced and oxidized species, F is Faraday's constant (96,487 C/mol), A is the area of the film, $C_o^*$ is the concentration of reacting species in the film, and $D_o$ is the diffusion constant describing the flux of charge in the material. $Q_d$ does not include the charging of reactive species adsorbed on the film surface and charging in the background electrolyte solution. However, these effects happen very quickly compared to the slow accumulation of charge from the diffusional component and are only seen at small values of $t^{1/2}$. $Q_d$ for values of $t^{1/2}$ between 0 and $\tau^{1/2}$ represents charge accumulation for the reduction process and charge accumulation for the oxidation process will happen in the reverse direction beginning at t=τ. $Q_d$ for both reduction and oxidation can be combined in an Anson plot as shown in FIG. 11, which can be used to calculate the diffusion constant for charged species in the film, $D_o$. For the Anson plot, the charge response of the reversed oxidation process is corrected for starting at t=t according to Equation 3:

$$Q_d(t > \tau) = \frac{2nFAD_o^{1/2}C_o^*t^{1/2}}{\pi^{1/2}}[t^{1/2} + (t-\tau)^{1/2} - t^{1/2}] \qquad (3)$$

Linear regression is used to collect the slope of the charge response for the reduction and oxidation of the film. The deviation from linearity at short times is due to the inability of the potentiostat to instantaneously change the applied potential. Therefore, the first 20% of the data points are discarded when calculating the slope. By rearranging Equation 2, one can solve for $D_o$ as follows:

$$D_o = \frac{\pi}{4}\left(\frac{S\phi}{Q}\right)^2 \qquad (4)$$

where S is the slope from the Anson Plot and $\phi$ is the thickness of the film. $D_o$ was calculated for the reduced and oxidized forms of CVD PEDOT using the two slopes in FIG. 11. Three methods were used to find Q, all of which gave a result having the same order of magnitude. Equation 1 was used to integrate current response data collected during each step of the experiment. Q was also calculated by integrating the oxidation peak in the cyclic voltammogram of the sample based on Equation 5:

$$Q = \frac{1}{v} \int_{E_1}^{E_2} I dE \qquad (5)$$

$E_1$ and $E_2$ are the potentials on either side of the oxidation peak and v is scan rate of the cyclic voltammetry experiment. Finally, Q was approximated according to the Faraday's Law for bulk electrolysis:

$$Q = FC_o A\phi \qquad (6)$$

The concentration of reactive species in the CVD PEDOT film, $C_o$, was calculated based on a density of 1 g/cm$^3$ for the film and using the monomer formula weight of 142 g/mol. An assumption was made that only one out of every three monomer units in the PEDOT chain reacts to the oxidized form. The charge accumulation in the CVD PEDOT film is on the order of $10^{-4}$ C/cm$^2$. The diffusion constant governing the flux of charges in reduced PEDOT is about $2\times10^{-10}$ cm$^2$/s, which is between one and two orders of magnitude larger than the diffusion constant of the oxidized material, $8\times10^{-12}$ cm$^2$/s. These values are on the order of diffusion coefficients for ion transport in polymers. [F. M. Gray, Royal Society of Chemistry (Great Britain), Polymer electrolytes, RSC materials monographs (Royal Society of Chemistry, Cambridge, 1997), pp. xii, 175 p.] Therefore, the switching time of PEDOT seems to be limited by the mobility of ions needed for charge balancing as opposed to the conduction of electron or holes in the material.

The dimensionless variable, $Dt/\phi^2$, was about 0.02 for the CVD PEDOT film used in this experiment based on the switching time of about 50 msec. $Dt/\phi^2$ is considerably less than one confirming that we were operating in a thin-layer regime where the thickness of the film is significantly smaller than the diffusion layer next to the electrode where concentrations differ from those in the bulk phase. Therefore, we can be confident that we are measuring diffusion-limited effects. Based on the same value of $Dt/\phi2=0.02$, CVD PEDOT films with a rate-limiting diffusion constant of $8\times10^{-12}$ cm$^2$/s and a slightly thinner thickness of 10 nm thick, could potentially be capable of switching speeds of about 2.5 msec.

As is shown herein, the CVD PEDOT of the invention is electrochromic and can be switched from a transparent light blue color to dark purple by applying a voltage. The maximum contrast is 16.5% with the strongest response being at 585 nm. The contrast can be increased by adding additional conjugated polymers that absorb in other regions of the visible spectrum. For example, layer-by-layer films of PEDOT and PANI have shown electrochromic contrasts as high as 82.1%. [D. M. DeLongchamp, M. Kastantin, P. T. Hammond, Chemistry of Materials 15, 1575 (2003).] PANI has a very light green color when it is oxidized and transforms to being nearly opaque in its reduced state. PANI absorbs blue light, so a film containing both PANI and PEDOT is virtually black when it is reduced. The CVD process should be compatible with the oxidative polymerization of PANI and could incorporate the material into PEDOT films as a separate layer or potentially as a copolymer. The contrast could also be increased with the use of thicker PEDOT films. The response is repeatable and the films return to their original optical properties after a complete redox cycle.

Results from potential step tests shows that a 50 nm film of CVD PEDOT has a switching speed of 27 msec for an 80% response during the oxidation reaction (dark to light) and 31.3 msec for reduction (light to dark). Dimensional analysis indicates that CVD PEDOT films 10 nm thick would be capable of switching speeds on the order of 1 msec. This is certainly fast enough for "electronic paper" applications and is reaching speeds that are needed in organic displays for portable appliances like PDAs.

Applications and Articles of the Invention. PEDOT has proven to be an extremely useful material for organic semiconductor devices. The ability to deposit PEDOT from the vapor phase will expand its utility in devices that already contain it and enable the development of new organic electronics including ones that are fabricated on unconventional substrates like paper and fabric. In addition, electrochromic responses of PEDOT can be applied in dynamically tinting window glass or as an organic memory device.

The CVD technique disclosed herein for PEDOT eliminates wet processing steps that can destroy some electronic devices and organic semiconductor layers through wetting or the spin-coating process often used to apply solution-based films. CVD PEDOT does not have inherent acidity known to corrode adjacent layers in devices causing early failure. The CVD coating process is compatible on a variety of organic and inorganic materials since it does not depend on evenly wetting the substrate surface. CVD provided a uniform coating on rough, fibrous, and porous morphologies with high surface areas. Increasing the effective surface area of devices will improve operating efficiencies. In addition, the ability to conformably coat rough and sharp electrode features will reduce the change of a short through the conducting polymer layer resulting in longer device lifetimes. Importantly, the compatibility of CVD with surfaces like paper, fabric and small particles, as well as traditional surfaces, will lead to novel and improved organic light emitting diodes (OLEDs), photovoltaics, simple transistors, electrochromic films, and super capacitors. In addition, the methods disclosed herein may be used in energy-saving devices such as plastic solar cells and electrochromic films for tinting architectural glass. Vapor-phase deposition of conducting organic materials for building inexpensive transistors on substrates like plastic, paper, and fabric could also be applied to polymeric radio-frequency identification (RFID) tags.

One aspect of the invention relates to an article coated with a conductive polymer coating, wherein said coating comprises an metal-containing oxidant and polymerized optionally substituted thiophenes, pyrroles, or anilines.

One aspect of the invention relates to an article coated with a conductive polymer coating, wherein said coating comprises an metal-containing oxidant and polymerized optionally substituted thiophenes.

In certain embodiments, the present invention relates to an aforementioned article, wherein said metal-containing oxidant is selected from the group consisting of iron(III) chloride, iron(III) toslyate, potassium iodate, potassium chromate, ammonium sulfate and tetrabutylammonium persulfate.

In certain embodiments, the present invention relates to an aforementioned article, wherein said metal-containing oxidant is iron(III) chloride.

In certain embodiments, a gaseous precursor, such as an epoxide, can be thermally activated with the use of a hot filament to provide an initiator for the oxidative polymerization of the conducting polymer.

In certain embodiments, the present invention relates to an aforementioned article, wherein said metal-containing oxidant has an oxidation potential between about 0.5 V and about 1.0 V.

In certain embodiments, the present invention relates to an aforementioned article, wherein said metal-containing oxidant has an oxidation potential of about 0.75 V.

In certain embodiments, the present invention relates to an aforementioned article, wherein said coating further comprise dopant anions or polyanions.

In certain embodiments, the present invention relates to an aforementioned article, wherein said dopant anion is selected from the group consisting of chloride, bromide, iodide, fluoride, phosphate and sulfonate.

In certain embodiments, the present invention relates to an aforementioned article, wherein said dopant anion is nitrosonium hexafluorophosphate.

In certain embodiments, the present invention relates to an aforementioned article, wherein said polymer coating comprises an optionally substituted thiophene, said optionally substituted thiophene represented by formula I:

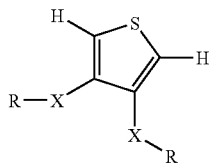

I wherein, independently for each occurrence, X is —O—, —S— or —N($R^A$)—; R is -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$; $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$; $R^B$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to an aforementioned article, wherein X is —O—.

In certain embodiments, the present invention relates to an aforementioned article, wherein R is alkyl.

In certain embodiments, the present invention relates to an aforementioned article, wherein X is —O—; and R is alkyl.

In certain embodiments, the present invention relates to an aforementioned article, wherein said polymer coating comprises an optionally substituted thiophene, said optionally substituted thiophene represented by formula II:

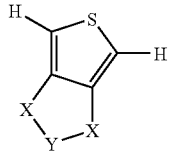

II wherein, independently for each occurrence, X is —O—, —S— or —N($R^A$)—; Y is —C($R^B$)$_2$—, —C($R^B$)$_2$C($R^B$)$_2$— or —C($R^B$)$_2$C($R^B$)$_2$C($R^B$)$_2$—; $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$; $R^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$; $R^C$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to an aforementioned article, wherein X is —O—.

In certain embodiments, the present invention relates to an aforementioned article, wherein Y is —C($R^B$)$_2$C($R^B$)$_2$—.

In certain embodiments, the present invention relates to an aforementioned article, wherein X is —O—; and Y is —C($R^B$)$_2$C($R^B$)$_2$—.

In certain embodiments, the present invention relates to an aforementioned article, wherein X is —O—; Y is —C($R^B$)$_2$C($R^B$)$_2$—; and $R^B$ is hydrogen or alkyl.

In certain embodiments, the present invention relates to an aforementioned article, wherein X is —O—; Y is —C($R^B$)$_2$C($R^B$)$_2$—; and $R^B$ is hydrogen.

In certain embodiments, the present invention relates to an aforementioned article, wherein X is —O—; Y is —C($R^B$)$_2$C($R^B$)$_2$—; $R^B$ is hydrogen; and said metal-containing oxidant is iron(III) chloride.

In certain embodiments, the present invention relates to an aforementioned article, wherein X is —O—; Y is —C($R^B$)$_2$C($R^B$)$_2$—; $R^B$ is hydrogen; said metal-containing oxidant is iron(III) chloride; and said gaseous base is present and is pyridine.

In certain embodiments, the present invention relates to an aforementioned article, wherein at least one surface of said article is paper, ceramic, carbon, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-tex®, Marlex®, expanded polytetrafluoroethylene (e-PTFE), low density polyethylene (LDPE), high density polyethylene (HDPE), polypropylene (PP), and poly(ethylene terephthalate) (PET).

In certain embodiments, the present invention relates to an aforementioned article, wherein said coating is of a uniform thickness (i.e., said thickness does not vary more than about 10% over the surface of the article; or by more than about 5% over the surface of the article; or by more than about 1% over the surface of the article.)

In certain embodiments, the present invention relates to an aforementioned article, wherein said polymer coating has a mass per surface area of less than about 500 μg/cm$^2$.

In certain embodiments, the present invention relates to an aforementioned article, wherein said polymer coating has a mass per surface area of less than about 100 μg/cm$^2$.

In certain embodiments, the present invention relates to an aforementioned article, wherein said polymer coating has a mass per surface area of less than about 50 μg/cm$^2$.

In certain embodiments, the present invention relates to an aforementioned article, wherein said polymer coating has a mass per surface area of less than about 10 μg/cm$^2$.

In certain embodiments, the present invention relates to an aforementioned article, wherein said polymer coating has a mass per surface area of less than about 5 μg/cm$^2$.

In certain embodiments, said article is or is incorporated into an organic memory device, a light-emitting diode, an electrochromic device, a display device, a photovoltaic device, a capacitor or a circuit board.

EXEMPLIFICATION

The invention now being generally described, it will be more readily understood by reference to the following examples, which are included merely for purposes of illustration of certain aspects and embodiments of the present invention, and are not intended to limit the invention.

Example 1

CVD Deposition and Characterization of PEDOT Films

Figure 3:
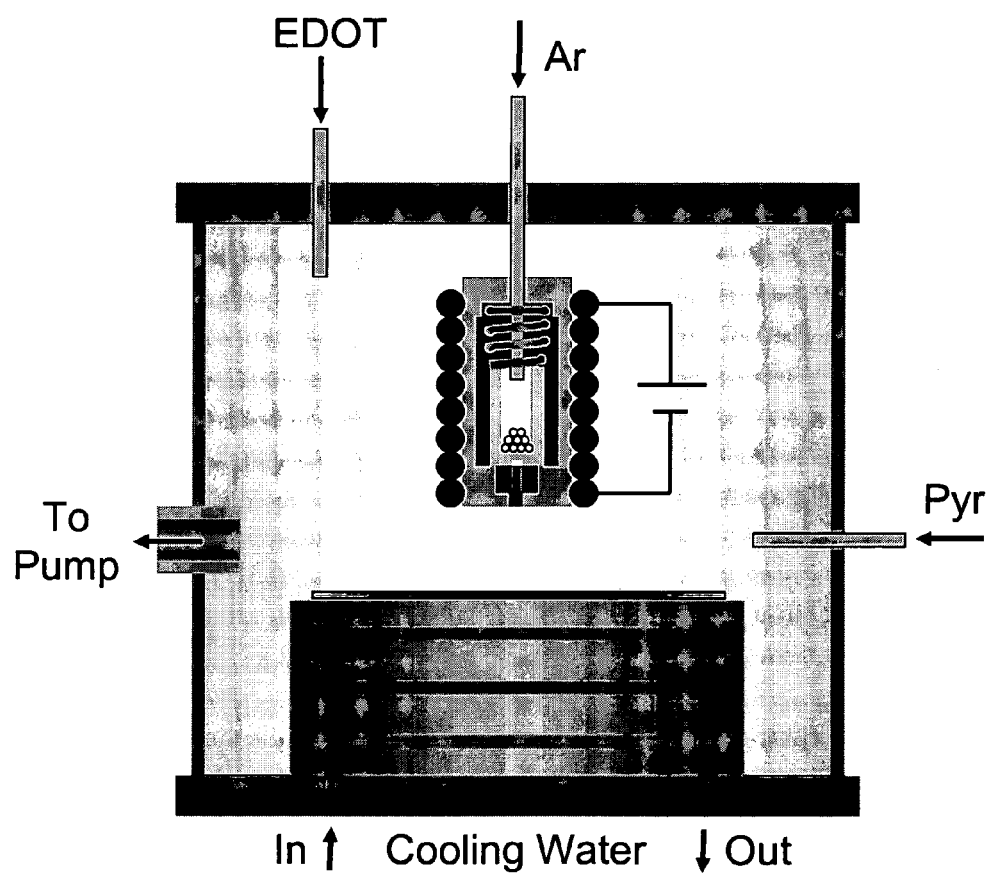
FIG. 3 depicts a schematic chemical vapor deposition (CVD) reactor for depositing PEDOT films.

PEDOT depositions were carried out in a custom-built vacuum chamber that has been described elsewhere and is depicted in FIG. 3. [D. D. Burkey, K. K. Gleason, J Appl Phys 93, 5143 (2003); H. G. Pryce-Lewis, D. J. Edell, K. K. Gleason, Chem Mater 12, 3488 (2000).] Glass slides and silicon wafers were used for substrates. The stage is regulated with cooling water and is normally kept at 34° C. A stage heater is available when stage temperatures greater than room temperature are desired. The stage can also be biased with a DC Voltage using a Sorenson DCS 600-1.7 power supply. The chamber pressure was controlled by a butterfly valve connected to an MKS model 252-A exhaust valve controller and was maintained at approximately 300 mTorr. $Fe(III)Cl_3$ (97%, Aldrich) was selected as the oxidant. The powder was loaded in a porous crucible with a nominal pore size of 7 μm and positioned above the stage. The crucible was heated to a temperature of about 240° C. where sublimation of the oxidant begins to occur. Argon (Grade 5.0, BOC Gases) was delivered into the crucible as a carrier gas for the $Fe(III)Cl_3$ vapors. An argon flow rate of 2 sccm was set using an MKS mass flow controller with a range of 50 sccm $N_2$. Once a yellow film of $Fe(III)Cl_3$ was observed on the substrate, the crucible temperature was reduced to end sublimation. EDOT monomer (3,4-ethylenedioxythiophene, Aldrich) heated to 100° C. is then introduced into the reactor through heated lines and using an MKS 1153 mass flow controller set at 95° C. The EDOT flow rate is normally 10 sccm. Pyridine (99%, Aldrich) at room temperature can be evaporated into the reactor using a needle valve to control the flow rate. A deposition time of 30 minutes was used for all of the films.

After deposition, the films were dried for at least 2 hours in a vacuum oven heated to 80° C. at a gauge pressure of −15 in. Hg. The thickness of the films deposited on glass were measured on a Tencor P-10 profilometer and conductivity measurements were done with a four-point probe (Model MWP-6, Jandel Engineering, Ltd). Films on silicon substrates were measured with FTIR (Nexus 870, Thermo Electron Corporation) for information on chemical composition. Deposited films were sometimes rinsed in methanol (HPLC Grade, J. T. Baker) or in a 5 mMol dopant solution of nitrosonium hexafluorophosphate, $NOPF_6$, (96%, Alfa Aesar) in acetonitrile (ACS Grade, EMT). The rinse step is intended to remove any unreacted monomer or oxidant in the films as well as short oligomers and reacted oxidant remaining in the form of $Fe(II)Cl_2$. After rinsing, the films changed from a cloudy light yellow color to a sky blue hue.

Electrochemical testing took place in an aqueous 0.1 M solution of sulfuric acid (VWR). The CVD PEDOT film on ITO was the working electrode, platinized copper was the counter electrode, and a saturated calomel electrode (SCE) was used as the standard. A potentiostat (EG&G Printon Applied Research Model 263A) scanned from −0.4 V to 0.6 V based on preliminary cyclovoltammograms. In-situ UV/NIS was conducted using an optical fiber to couple light from a StellarNet SLI light source with a tungsten krypton bulb emitting from 350 to 1700 nm. The spectrometer was a StellarNet EPP 2000 having a detector with a range spanning 190 to 2200 nm.

Example 2

In-situ Polymerization of Standard PEDOT Films

A Bayer formula for the in-situ polymerization of BAYTRON M was used to make a standard PEDOT film. 1 mL of EDOT monomer and 39 mL BAYTRON C were combined and allowed to mix for 10 minutes. The solution was then spun onto silicon and glass at 3000 rpm for 40 seconds using a spincoater (Model P6700, Specialty Coating Systems). The films were heated to 80° C. under vacuum for 10 minutes, rinsed in methanol, and allowed to dry. FTIR spectra and conductivity measurements were collected for the standard PEDOT material.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method of forming a conducting polymer coating on a surface, comprising the steps of:
   subliming a metal-containing oxidant, wherein said metal-containing oxidant is positioned above said surface in a vacuum chamber, thereby forming a gaseous metal-containing oxidant;
   contacting said surface with a gaseous metal-containing oxidant, thereby forming an oxidant-enriched surface;
   contacting said oxidant-enriched surface with a gaseous base;
   heating said oxidant-enriched surface at a temperature greater than room temperature, thereby forming a heated oxidant-enriched surface; and then
   contacting said heated oxidant-enriched surface with a gaseous monomer, wherein said gaseous monomer is selected from the group consisting of optionally substituted thiophenes, pyrroles, and anilines, thereby forming a conducting polymer coated surface.

2. The method of claim 1, wherein said metal-containing oxidant is selected from the group consisting of iron(III) chloride, iron(III) toslyate, potassium iodate, potassium chromate, ammonium sulfate and tetrabutylammonium persulfate.

3. The method of claim 1, wherein said gaseous base is an optionally substituted pyridine.

4. The method of claim 1, further comprising the step of washing said conducting polymer coated surface with a solvent.

5. The method of claim 4, wherein said solvent is selected from the group consisting of water, methanol, ethanol, isopropanol, acetonitrile and mixtures thereof.

6. The method of claim 1, further comprising the step of contacting said conducting polymer coated surface with a dopant anion.

7. The method of claim 6, wherein said dopant anion is selected from the group consisting of chloride, bromide, iodide, fluoride, phosphate, hexafluorophosphate, and sulfonate.

8. The method of claim 1, further comprising the step of warming said conducting polymer coated surface under vacuum, thereby forming a substantially dried conducting polymer.

9. The method of claim 1, wherein said surface is selected from the group consisting of paper, ceramic, carbon, fabric, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-tex®, Marlex®, expanded polytetrafluoroethylene (e-PTFE), low density polyethylene (LDPE), high density polyethylene (HDPE), polypropylene (PP), and poly(ethylene terephthalate) (PET).

10. A method of forming a conducting polymer coating on a surface, comprising the steps of:
    subliming a oxidant, wherein said oxidant is positioned above said surface in a vacuum chamber, thereby forming a gaseous oxidant;
    contacting said surface with a gaseous oxidant, thereby forming an oxidant-enriched surface;
    contacting said oxidant-enriched surface with a gaseous base;
    heating said oxidant-enriched surface at a temperature greater than room temperature, thereby forming a heated oxidant-enriched surface; and then
    contacting said heated oxidant-enriched surface with a gaseous monomer, wherein said gaseous monomer is an optionally substituted thiophene, thereby forming a conducting polymer coated surface.

11. The method of claim 10, wherein said gaseous monomer is an optionally substituted thiophene represented by formula I:

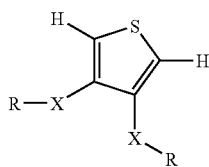

I wherein, independently for each occurrence,
    X is —O—, —S— or —N($R^A$)—;
    R is -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$;
    $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$;
    $R^B$ is -hydrogen, -alkyl, -cycloalkyl, -heterocycloalkyl, -alkenyl, -cycloalkenyl, -heterocycloalkenyl, -alkynyl, -aryl or -heteroaryl; and
    p is 0-5 inclusive.

12. The method of claim 11, wherein X is —O—.

13. The method of claim 11, wherein R is alkyl.

14. The method of claim 11, wherein X is —O—; and R is alkyl.

15. The method of claim 10, wherein said gaseous monomer is an optionally substituted thiophene represented by formula II:

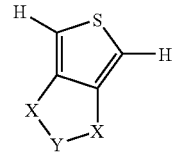

II wherein, independently for each occurrence,
    X is —O—, —S— or —N($R^A$)—;
    Y is —C($R^B$)$_2$—, —C($R^B$)$_2$C($R^B$)$_2$— or —C($R^B$)$_2$C($R^B$)$_2$C($R^B$)$_2$—;
    $R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$;
    $R^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$;
    $R^C$ is -hydrogen, -alkyl, -cycloalkyl, -heterocycloalkyl, -alkenyl, -cycloalkenyl, -heterocycloalkenyl, -alkynyl, -aryl or -heteroaryl; and
    p is 0-5 inclusive.

16. The method of claim 15, wherein X is —O—.

17. The method of claim 15, wherein Y is —C($R^B$)$_2$C($R^B$)$_2$—.

18. The method of claim 15, wherein X is —O—; Y is —C($R^B$)2C($R^B$)$_2$—.

19. The method of claim 15, wherein X is —O—; Y is —C($R^B$)$_2$C($R^B$)$_2$—; and $R^B$ is hydrogen or alkyl.

20. A method of forming a conducting polymer coating on a surface, comprising the steps of:
    subliming a oxidant, wherein said oxidant is positioned above said surface in a vacuum chamber, thereby forming a gaseous oxidant;
    contacting said surface with a gaseous oxidant, thereby forming an oxidant-enriched surface;
    contacting said oxidant-enriched surface with a gaseous base;
    heating said oxidant-enriched surface at a temperature greater than room temperature, thereby forming a heated oxidant-enriched surface; and then
    contacting said heated oxidant-enriched surface with a gaseous monomer, wherein said gaseous monomer is 3,4-ethylenedioxythiophene, thereby forming a conducting polymer coated surface,
    wherein
    said conducting polymer has a conductivity greater than about 4 S/cm.

21. The method of claim 20, wherein said gaseous base is an optionally substituted pyridine.

22. The method of claim 1, wherein said oxidant-enriched surface is heated at a temperature of about 34° C.

23. The method of claim 1, wherein said oxidant-enriched surface is heated at a temperature of above about 60° C.

24. The method of claim 10, wherein said oxidant-enriched surface is heated at a temperature of about 34° C.

25. The method of claim 10, wherein said oxidant-enriched surface is heated at a temperature of above about 60° C.

26. The method of claim 20, wherein said oxidant-enriched surface is heated at a temperature of about 34° C.

27. The method of claim 20, wherein said oxidant-enriched surface is heated at a temperature of above about 60° C.

28. The method of claim 19, wherein said conducting polymer has a conductivity greater than about 4 S/cm.

29. The method of claim 1, wherein the pressure is about 300 mtorr.

30. The method of claim 10, wherein the pressure is about 300 mtorr.

31. The method of claim 20, wherein the pressure is about 300 mtorr.

* * * * *

UNITED STATES PATENT AND TRADEMARK OFFICE
CERTIFICATE OF CORRECTION

PATENT NO. : 7,618,680 B2  Page 1 of 1
APPLICATION NO. : 11/141353
DATED : November 17, 2009
INVENTOR(S) : Gleason et al.

It is certified that error appears in the above-identified patent and that said Letters Patent is hereby corrected as shown below:

Delete Col. 30, ln. 40 and insert Col. 30, ln. 40 --contacting said surface with said gaseous metal-containing--

Delete Col. 31, ln. 20 and insert Col. 31, ln. 20 --subliming an oxidant, wherein said oxidant is positioned--

Delete Col. 31, ln. 23 and insert Col. 31, ln. 23 --contacting said surface with said gaseous oxidant, thereby--

Delete Col. 32, ln. 29 and insert Col. 32, ln. 29 --$C(R^B)_2C(R^B)_2$--

Delete Col. 32, ln. 34 and insert Col. 32, ln. 34 --subliming an oxidant, wherein said oxidant is positioned--

Delete Col. 32, ln. 37 and insert Col. 32, ln. 37 --contacting said surface with said gaseous oxidant, thereby--

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,618,680 B2 Page 1 of 1
APPLICATION NO. : 11/141353
DATED : November 17, 2009
INVENTOR(S) : Gleason et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 986 days.

Signed and Sealed this

Twenty-sixth Day of October, 2010

David J. Kappos
*Director of the United States Patent and Trademark Office*